United States Patent
Kato

(10) Patent No.: US 7,692,999 B2
(45) Date of Patent: Apr. 6, 2010

(54) NONVOLATILE MEMORY AND SEMICONDUCTOR DEVICE INCLUDING NONVOLATILE MEMORY

(75) Inventor: Kiyoshi Kato, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 270 days.

(21) Appl. No.: 12/003,280

(22) Filed: Dec. 21, 2007

(65) Prior Publication Data

US 2008/0151602 A1   Jun. 26, 2008

(30) Foreign Application Priority Data

Dec. 25, 2006   (JP)   ............... 2006-347278

(51) Int. Cl.
*G11C 5/14* (2006.01)

(52) U.S. Cl. ............... 365/227; 365/230.06; 365/203

(58) Field of Classification Search ............... 365/227, 365/230.06, 203

See application file for complete search history.

(56) References Cited

U.S. PATENT DOCUMENTS 5,604,711 A * 2/1997 Cheung ............... 365/230.06

| | | | |
|---|---|---|---|
| 7,284,703 B2 | 10/2007 | Powell et al. | |
| 2007/0147151 A1 | 6/2007 | Kurokawa | |
| 2007/0215869 A1 | 9/2007 | Moriya et al. | |
| 2007/0230249 A1 | 10/2007 | Miyaki et al. | |

FOREIGN PATENT DOCUMENTS

JP   2005-316724   11/2005
JP   2006-503376   1/2006

* cited by examiner

*Primary Examiner*—Hoai V Ho
*Assistant Examiner*—Jason Lappas
(74) *Attorney, Agent, or Firm*—Eric J. Robinson; Robinson Intellectual Property Law Office, P.C.

(57) ABSTRACT

An object is to provide a nonvolatile memory with reduced power consumption. The nonvolatile memory includes a memory element that has a low resistance state and a high resistance state, a writing circuit, a resistance element, a voltage source input terminal that inputs a writing voltage to the writing circuit, a bit line driver circuit that selects whether the memory element is connected to the writing circuit, and a word line driver circuit that selects whether or not writing is done in the memory element. With such as structure, power consumption during writing can be reduced, and a nonvolatile memory with low power consumption can be realized. Further, with such a nonvolatile memory, an active type wireless tag with a long lifetime of a battery or a passive type wireless tag with a wide communication range in which writing to a memory is possible, can be realized.

33 Claims, 20 Drawing Sheets

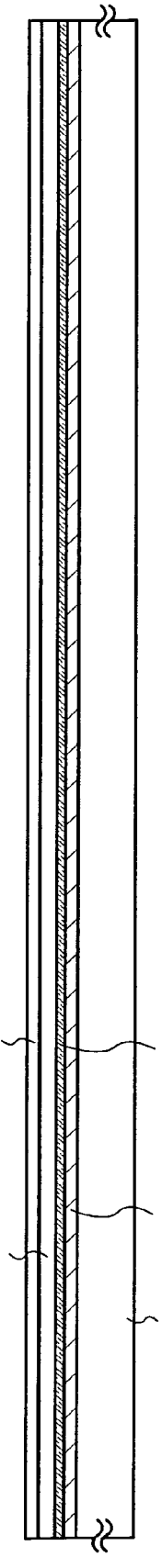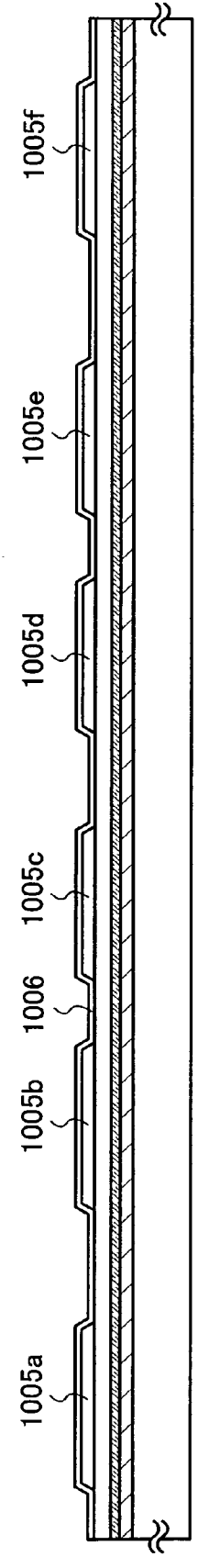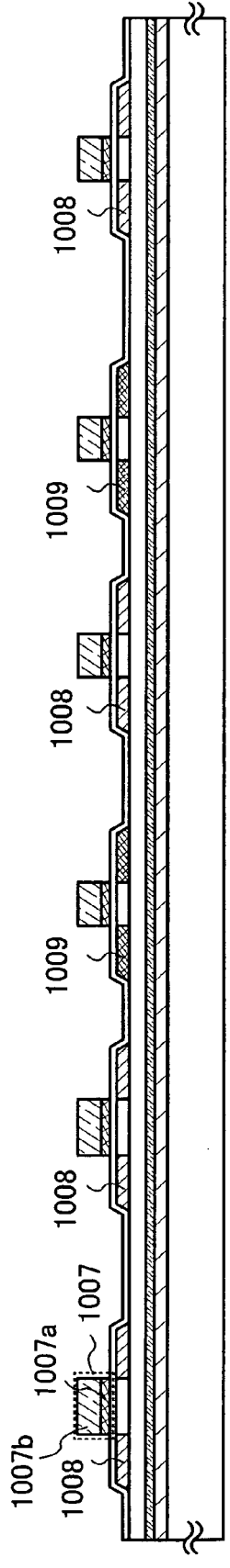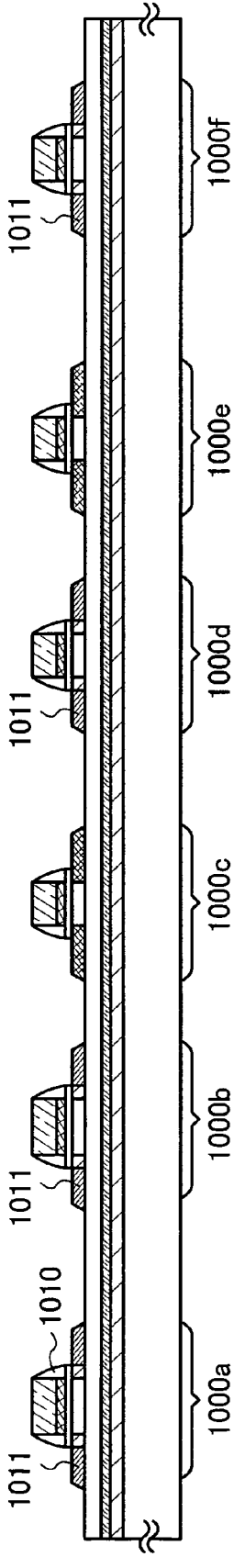

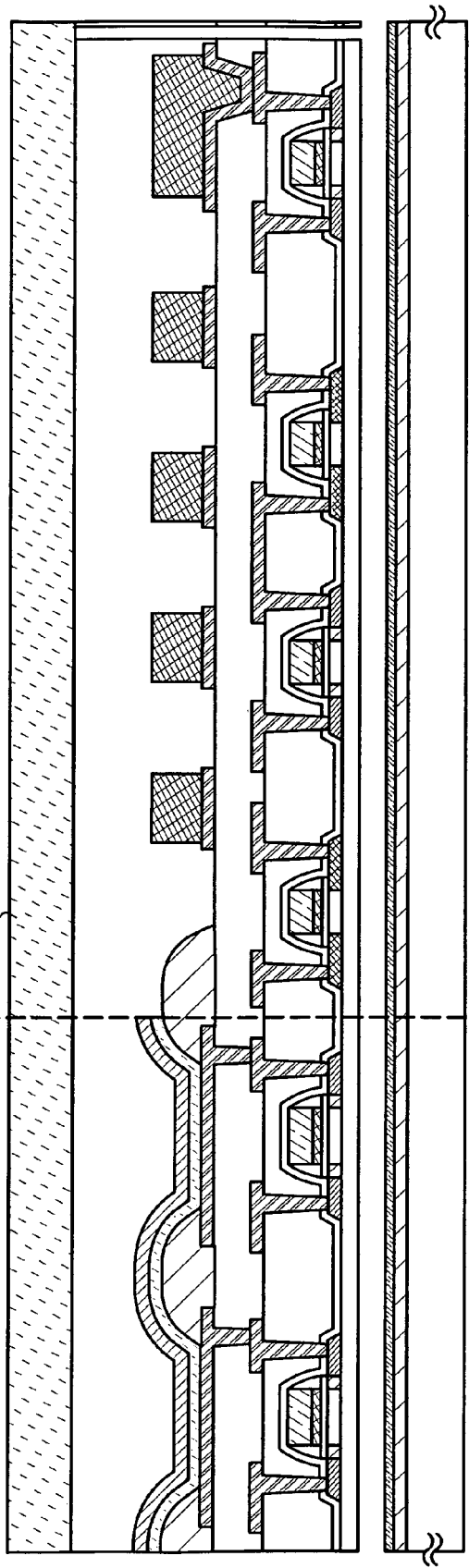
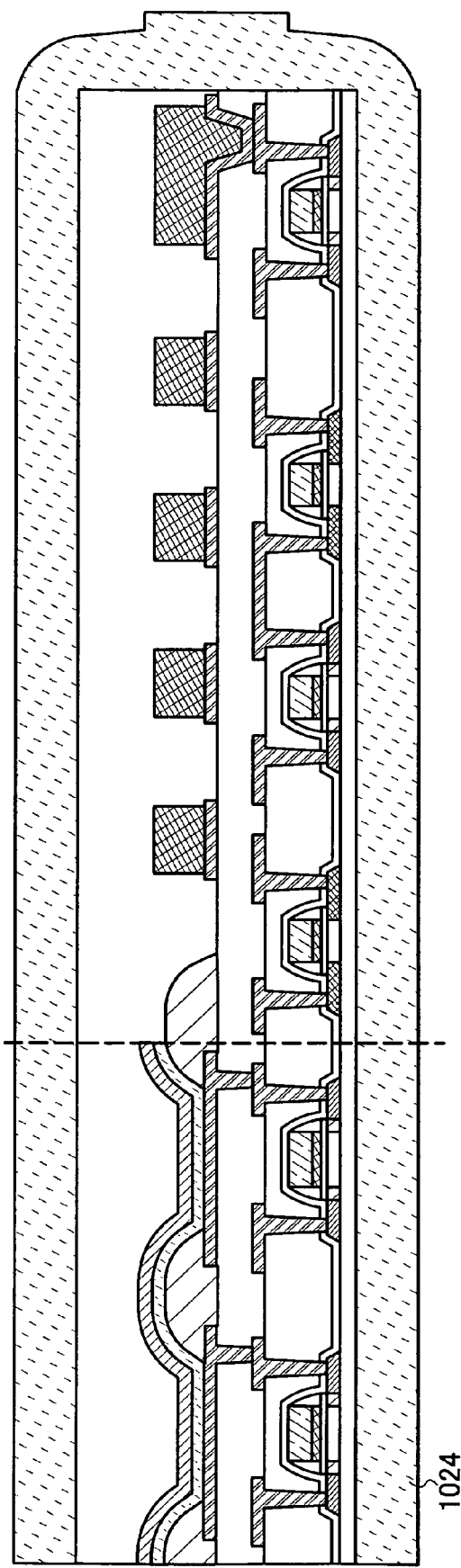
FIG. 12A
FIG. 12B
1023
1024

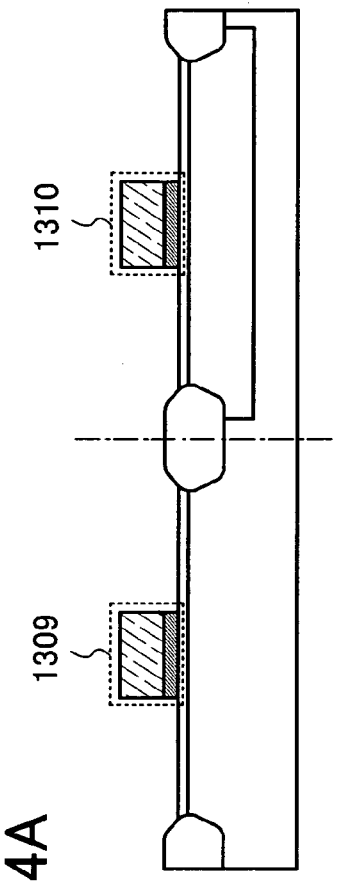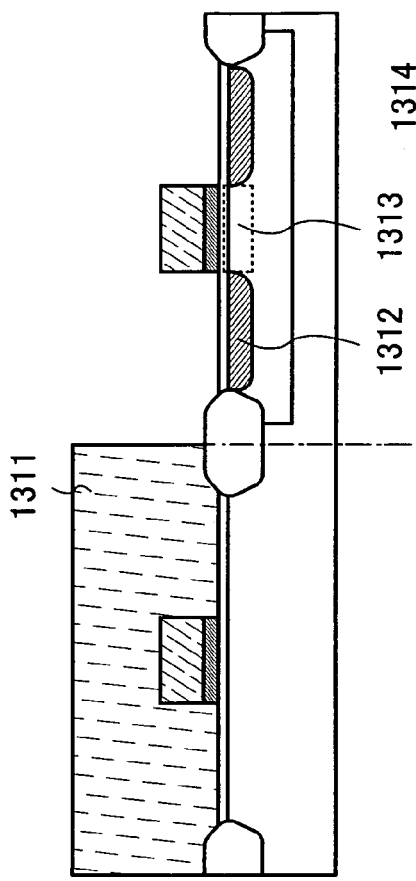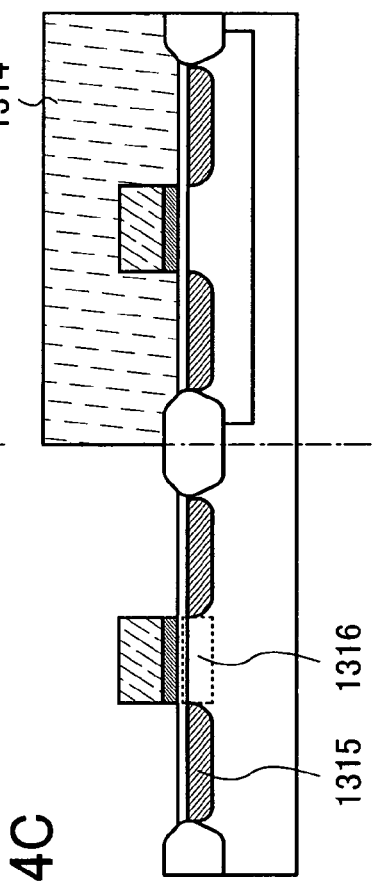

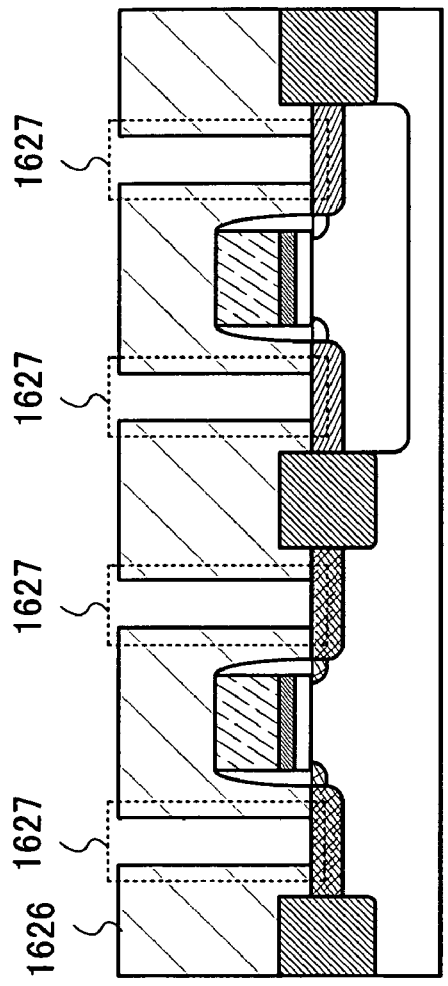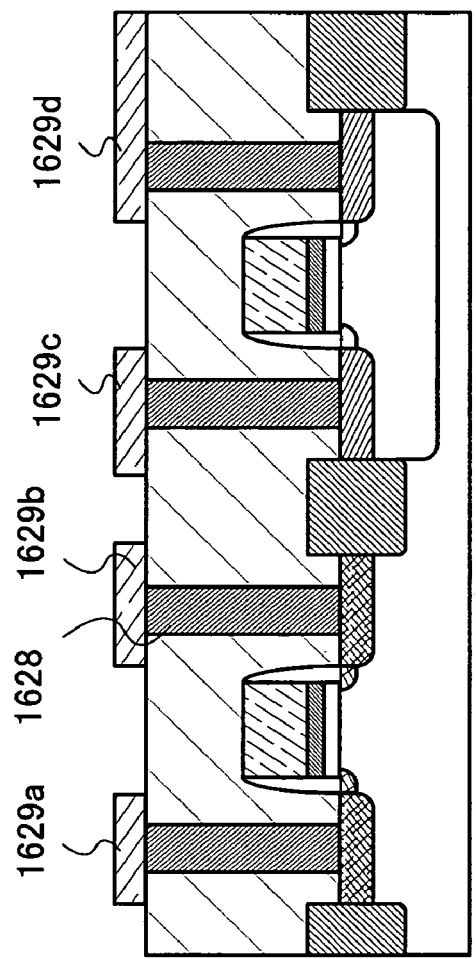
FIG. 19A
FIG. 19B

NONVOLATILE MEMORY AND SEMICONDUCTOR DEVICE INCLUDING NONVOLATILE MEMORY

BACKGROUND OF THE INVENTION

1. Field of the Invention

The present invention relates to a nonvolatile memory and a semiconductor device including the nonvolatile memory.

2. Description of the Related Art

A memory element composing a nonvolatile memory has a low resistance state and a high resistance state. A memory element is called an anti-fuse type if a resistance is high in an initial state, and it is called a fuse type if the resistance is low in the initial state.

These nonvolatile memories are effective when they are mounted to tags that perform wireless communication (also called "RFID tag," "wireless tag," or the like), because they do not need power sources when holding data. In particular, a write-once memory has received attention as a memory with high security, because it cannot be erased once it is written in. Note that wireless tags can be largely classified into two types: an active-type incorporated with a power source (for example, a battery) for driving; and a passive-type that is driven by utilizing power of an electric wave or electromagnetic wave (carrier wave) from outside (refer to Patent Document 1: Japanese Published Patent Application No. 2005-316724 for the active-type, and to Patent Document 2: Japanese Translation of PCT International Application No. 2006-503376 for the passive-type).

SUMMARY OF THE INVENTION

With the active-type wireless tag, there is a problem that the battery is depleted over time depending on the intensity of electric wave necessary for communication, and ultimately, power that is necessary for driving cannot be obtained. Further, with the passive-type wireless tag, there is a problem that it is limited to uses with short communication distance.

Further, writing to a nonvolatile memory is an operation with large power consumption, since a high voltage or high current is usually necessary. Therefore, in an active-type wireless tag including such nonvolatile memory, lifetime of the battery becomes even shorter, and in an passive-type wireless tag including such nonvolatile memory, communication distance with which writing to the memory is possible becomes even shorter. In this manner, when a nonvolatile memory with large power consumption is mounted to a wireless tag, problems in each type of wireless tag become more pronounced.

In view of the above problem, an object of the present invention is to realize a nonvolatile memory with reduced power consumption. In addition, another object is to provide an active-type wireless tag with a battery that has a long lifetime, or a passive-type wireless tag with a wide communication range in which writing in the memory is possible.

To reduce current consumption when writing to the memory, reduction of a writing voltage, shortening of a writing period can be considered; however, both need characteristic improvements of a memory element. The inventor focused on an observation that in a writing operation of an anti-fuse type nonvolatile memory, a large current flows right after a memory element changes from being in a high resistance state to a low resistance state, and power consumption becomes large. Consequently, the inventor came up with a structure of inserting a resistance element in a current pathway where the large current flows, that is, a structure of the present invention in which the resistance element is provided to be in series with the memory element.

One feature of the present invention is a nonvolatile memory including a memory element that has a low resistance state and a high resistance state; a writing circuit; a resistance element; a voltage source input terminal that inputs a writing voltage to the writing circuit; a bit line driver circuit that selects whether or not the memory element is connected to the writing circuit; and a word line driver circuit that selects whether or not writing is done in the memory element. A current that flows into the memory element when writing in the memory element is supplied from the voltage source input terminal through the writing circuit, and the resistance element is provided in a pathway of the current.

Another feature of the present invention is a nonvolatile memory including a memory element that has a low resistance state and a high resistance state; a writing circuit; a reading circuit; a resistance element; a voltage source input terminal that inputs a writing voltage to the writing circuit; a bit line driver circuit that selects whether or not the memory element is connected to the writing circuit or the reading circuit; and a word line driver circuit that selects whether or not writing is done in the memory element. A current that flows into the memory element when writing in the memory element is supplied from the voltage source input terminal through the writing circuit, and the resistance element is provided in a pathway of the current.

Yet another feature of the present invention is a nonvolatile memory including a memory element that has a low resistance state and a high resistance state; a writing circuit; a reading circuit; a resistance element; a voltage source input terminal that inputs a writing voltage to the writing circuit; a bit line driver circuit that selects whether or not the memory element is connected to the writing circuit or the reading circuit; and a word line driver circuit that selects whether or not writing is done in the memory element. A current that flows into the memory element during writing in the memory element is supplied from the voltage source input terminal through the writing circuit, and the resistance element is provided in a pathway of the current that is not a pathway of a current that flows into the memory element during reading.

Still another feature of the present invention is a nonvolatile memory including a memory element that has a low resistance state and a high resistance state; a writing circuit; a resistance element; a voltage source input terminal that inputs a writing voltage to the writing circuit; a bit line driver circuit that selects whether or not the memory element is connected to the writing circuit; and a word line driver circuit that selects whether or not writing is done in the memory element. The bit line driver circuit is connected to the memory element through a bit line, an electrical pathway that transmits a writing voltage is formed between the voltage source input terminal and a bit line connected to the memory element, during writing in the memory element, and the resistance element is provided in the electrical pathway.

Another feature of the present invention is a nonvolatile memory including a memory cell including a memory element that has a low resistance state and a high resistance state; a writing circuit; a resistance element; a voltage source input terminal that inputs a writing voltage to the writing circuit; a bit line driver circuit that selects whether or not the memory element is connected to the writing circuit; and a word line driver circuit that selects whether or not writing is done in the memory element. A first electrode of the memory element is connected to the bit line driver circuit through a bit line, a second electrode of the memory element is connected to the word line driver circuit through a word line, and the resistance element is provided between the voltage source input terminal and the memory cell so as to be in series with the memory element.

In the foregoing structure, the memory cell may include a diode that is connected to the memory element in series. Further, the memory element transitions from a high resistance state to a low resistance state when writing.

Another feature of the present invention is a nonvolatile memory including a memory cell; a writing circuit; a resistance element; a voltage source input terminal that inputs a writing voltage to the writing circuit; a bit line driver circuit that selects whether or not the memory element is connected to the writing circuit; and a word line driver circuit that selects whether or not writing is done in the memory element. The memory cell includes a memory element that has a low resistance state and a high resistance state and a transistor, the bit line driver circuit is connected to the memory element through a bit line and the transistor, and the word line driver circuit is connected to a gate electrode of the transistor through a word line. Further, the memory element transitions from a high resistance state to a low resistance state by supplying a potential from the voltage source input terminal, and the resistance element is provided between the voltage source input terminal and the memory cell so as to be in series with the memory element.

It is needless to say that a nonvolatile memory may have a structure of including a plurality of memory cells.

Note that a resistance of the resistance element is preferably smaller than a resistance of a memory element in a high resistance state. Typically, when the resistance of the resistance element is less than or equal to ⅓, preferably less than or equal to ⅒ of the resistance of the memory element in a high resistance state, a writing voltage can be suppressed to be low, which is preferable. In addition, the resistance of the resistance element is preferably larger than a resistance of the memory element in a low resistance state. Typically, when the resistance of the resistance element is more than or equal to, preferably more than or equal to 3 times the resistance of the memory element in a low resistance state, current consumption can be suppressed to be small, which is preferable.

Accordingly, it is preferable that the resistance of the memory element in a high resistance state and a low resistance state differs significantly. Typically, the resistance in a high resistance state is more than or equal to 10 times, preferably more than or equal to 100 times the resistance in a low resistance state.

Note that the resistance element can be formed using, for example, a resistor composed of a semiconductor layer, a metal thin film, a diode-connected transistor, or a transistor in which a gate electrode is controlled.

With such structure, a large current during writing can be controlled pretty much without affecting writing performance. Accordingly, a nonvolatile memory with low power consumption can be provided.

In addition, one feature of the present invention may be a semiconductor device that includes a nonvolatile memory of the present invention and performs wireless communication, for example, a wireless tag. Note that wireless communication may be performed using an antenna, for example. Further, the semiconductor device may also include a battery.

In the present invention, a transistor is not particularly limited. A transistor such as the following can be applied: a thin film transistor (TFT) using a non-single-crystal semiconductor film typified by amorphous silicon and polycrystalline silicon; a transistor formed using a semiconductor substrate or an SOI substrate; a MOS transistor; a junction type transistor; a bipolar transistor; a transistor using a compound semiconductor such as ZnO or a-InGaZnO; or a transistor using an organic semiconductor or carbon nanotube. In addition, the type of substrate over which transistors are arranged is not particularly limited either, and for example, a single-crystal substrate, an SOI substrate, a glass substrate, a plastic substrate, or the like can be used.

A switch described in this specification may be an electrical switch or a mechanical switch, and is not particularly limited provided that the switch can control flow of current. The switch may be a transistor, a diode, or a logic circuit that combines a transistor and a diode. For example, when a transistor is used for the switch, since the transistor operates as a mere switch, the polar character (conductivity type) of the transistor is not particularly limited. However, it is desirable that the polar character is that with less off current. For example, as a transistor with small off current, there is a transistor with a structure provided with an LDD region, a transistor with a multi-gate structure, or the like.

According to the present invention, a nonvolatile memory having low power consumption, for which current consumption during writing is reduced, can be realized. Further, by including the nonvolatile memory of the present invention, an active-type wireless tag with a long lifetime of a battery, or a passive-type wireless tag with a wide communication range in which writing to the memory is possible.

BRIEF DESCRIPTION OF DRAWINGS

In the following drawings:

FIGS. 10A to 10D are partial cross-sectional diagrams of a semiconductor device of the present invention;

FIGS. 12A and 12B are partial cross-sectional diagrams of a semiconductor device of the present invention;

FIGS. 14A to 14C are partial cross-sectional diagrams of a transistor included in a semiconductor device of the present invention;

FIGS. 19A and 19B are partial cross-sectional diagrams of a transistor included in a semiconductor device of the present invention.

DETAILED DESCRIPTION OF THE INVENTION

Embodiment Mode

Figure 1:
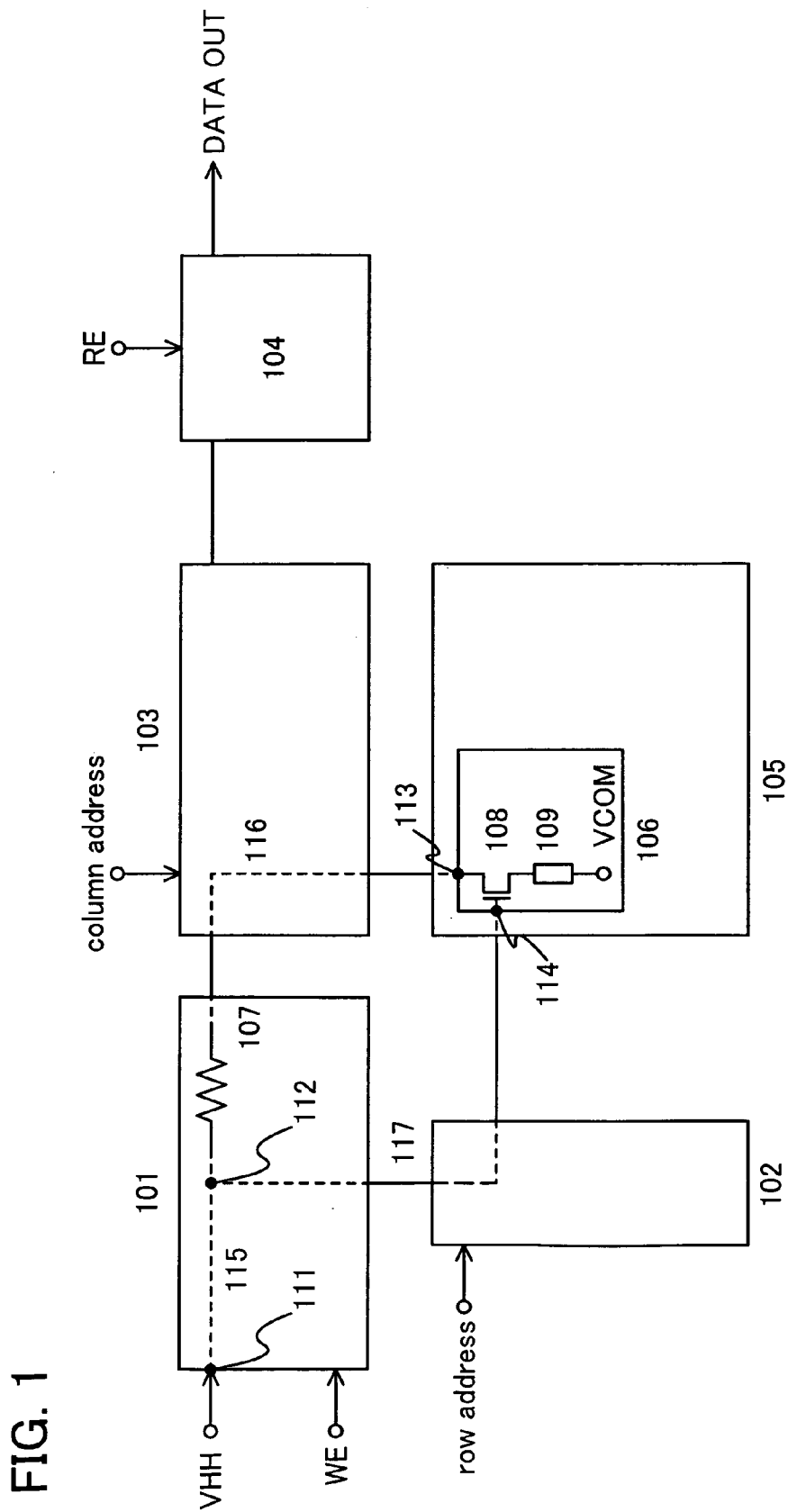
FIG. 1 describes a nonvolatile memory of the present invention.

Embodiment modes and embodiments of the present invention will hereinafter be described with reference to drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes and embodiments to be given below. Note that in the following description of the present invention, reference numerals denoting identical portions may be used in common in different drawings.

Embodiment Mode 1

A structural example of a nonvolatile memory of the present invention is described with reference to the block diagram in FIG. 1.

The nonvolatile memory shown in FIG. 1 has a writing circuit 101, a word line driver circuit 102, a bit line driver circuit 103, a reading circuit 104, and a memory cell array 105 including a plurality of memory cells 106. Each memory cell 106 has a transistor 108 and a memory element 109.

A column address is input to the bit line driver circuit 103, and a bit line of a column that the address specifies is connected to the writing circuit 101 or the reading circuit 104. A row address is input to the word line driver circuit 102, and a word line of a row that the address specifies is connected to the writing circuit 101 or a predetermined power source line. A reading control signal RE is input to the reading circuit and a data signal DATA OUT is generated based on a state of the memory element 109 included in the memory cell 106 that is selected during reading. A writing control signal WE is input to the writing circuit 101, and a potential necessary for writing is supplied to the bit line driver circuit 103 or the word line driver circuit 102 during writing.

In FIG. 1, a pathway relating to a writing operation is shown using dotted lines. A potential that is supplied to a high-potential input terminal 111 of the writing circuit and is needed for writing in the memory element is a potential VHH. Note that the potential VHH is also called "power source potential VHH for writing". Pathways in which a high potential is transmitted to a memory cell are separated into the following: a pathway 115 that connects the high-potential input terminal 111 of the writing circuit and a node 112; a pathway 116 that connects the node 112 and a terminal 113 of a memory cell that is connected to a bit line; and a pathway 117 that connects the node 112 and a terminal 114 of a memory cell that is connected to a word line. In addition, the resistance element 107 (resistance R1) is connected to the pathway 116 so as to be in series with the memory element 109.

Note that here, the memory element 109 is described using an example of an anti-fuse type memory element. The memory element 109 has a low resistance state (effective resistance RL) and a high resistance state (effective resistance RH). The description is made for a case of applying a predetermined voltage (V1) to the memory element so that the memory element transitions from a high resistance state to a low resistance state, that is, in the case of writing.

When writing, a high potential is applied to a gate electrode of the transistor 108 via the pathway 117 to turn on the transistor 108, while applying a high potential to the terminal 114 via the pathway 116. As a result, the predetermined voltage V1 is applied to the memory element 109 and writing is performed.

In such a writing operation, when the memory element 109 transitions from a high resistance state to a low resistance state, a current value that flows into the memory element also changes. For example, if a constant voltage V1 is applied to the memory element 109, a current with a current value that is inversely proportionate to a resistance of the memory element 109 flows. Accordingly, although there is a possibility that a large current is fed to the memory element 109 after transitioning to a low resistance state, by having a resistance element 107, a current that is fed to the memory element 109 in a low resistance state can be reduced.

A current that is fed to the memory element 109 in a low resistance state is about I1=VHH/(RL+Rp) without the resistance element 107, and about I2=VHH/(RL+R1+Rp) with the resistance element 107. Note that resistance Rp represents a total of resistive components of the pathways 115 and 116 other than those of the memory element 109 and the resistance element 107. Accordingly, it is observed that with I1>I2, by an existence of the resistance element 107, the current value that is fed to the memory element 109 is reduced.

Next, a resistance R1 of the resistance element 107 is discussed.

The resistance R1 of the resistance element 107 is preferably smaller than a resistance RH of the memory element 109 in a high resistance state. When the resistance R1 is smaller, voltage drop at the resistance element 107 when the memory element 109 is in a high resistance state is small, and voltage VHH that is applied to the high-potential input terminal 111 can be reduced.

For example, if R1 and RH are about the same, VHH needs about twice the voltage of V1. On the other hand, if resistance R1 is made to be less than or equal to ⅓ of resistance RH, an increase in VHH can be suppressed to about a 30% increase at most, which is preferable. Further, if resistance R1 is made to be less than or equal to 1/10 of resistance RH, the increase in VHH can be suppressed to about a 10% increase at most, which is preferable since voltage necessary for writing can be suppressed to be even lower.

In addition, resistance R1 of the resistance element 107 is preferably larger than resistance RL of the memory element 109 in a low resistance state. This is clear by a comparison of the foregoing current values I1 and I2. For example, when Rp<<RL, where resistive components other than those of the memory element 109 and the resistance element 107 are small, I2 can be suppressed to about ½ of I1 if R1 and RL are about the same. Further, if resistance R1 is made to be more than or equal to 3 times the resistance RL, I2 can be suppressed to less than or equal to about ¼ of I1.

Accordingly, it is preferable that the resistance of the memory element 109 in a high resistance state and the resistance in a low resistance state differ significantly. By the resistance of the memory element 109 in a high resistance state and the resistance in a low resistance state differing significantly, resistance R1 can be made to be a preferable resistance, and a current that flows into the memory element in a low resistance state can be reduced without affecting a power source potential for writing.

If RH is more than or equal to 10 times RL, when for example resistance R1 of the resistance element 107 is about the same as RL, current consumption in a low resistance state can be suppressed to about ½, almost without a rise in the power source potential for writing due to the resistance element 107, which is preferable. In addition, if RH is more than or equal to 100 times RL, when for example resistance R1 of the resistance element 107 is about 10 times RL, current consumption in a low resistance state can be suppressed to about ¹⁄₁₀, almost without a rise in the power source potential for writing due to the resistance element 107, which is extremely preferable.

Next, a position where the resistance element 107 is connected is discussed.

As mentioned above, it is acceptable as long as the resistance element 107 is provided in a pathway that is taken by a current fed to the memory element 109, so as to be in series with the memory element 109. Accordingly, for example, it is preferable that the resistance element 107 is provided in the pathway 116 as shown in FIG. 1. On the other hand, since almost no current is consumed by the pathway 117, an effect of reduction in current consumption is not obtained by providing the resistance element 107 in the pathway 117. In addition, proving the resistance element 107 in the pathway 115 is as effective as providing the resistance element 107 in the pathway 116.

In addition, it is preferable that the resistance element 107 is not provided in a pathway of a current that flows into the memory element 109 during reading. Accordingly, current consumption during writing can be reduced without affecting a reading operation. Note that the resistance element 107 may be provided in a pathway of a current that flows into the memory element 109 during reading. In such a case, reading can also be carried out by providing a reading circuit that takes into consideration the resistance element 107.

Accordingly, by the present invention, a low power consumption nonvolatile memory with decreased current consumption during writing can be realized.

Note that for the resistance element 107, a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Embodiment Mode 2

Figure 2:
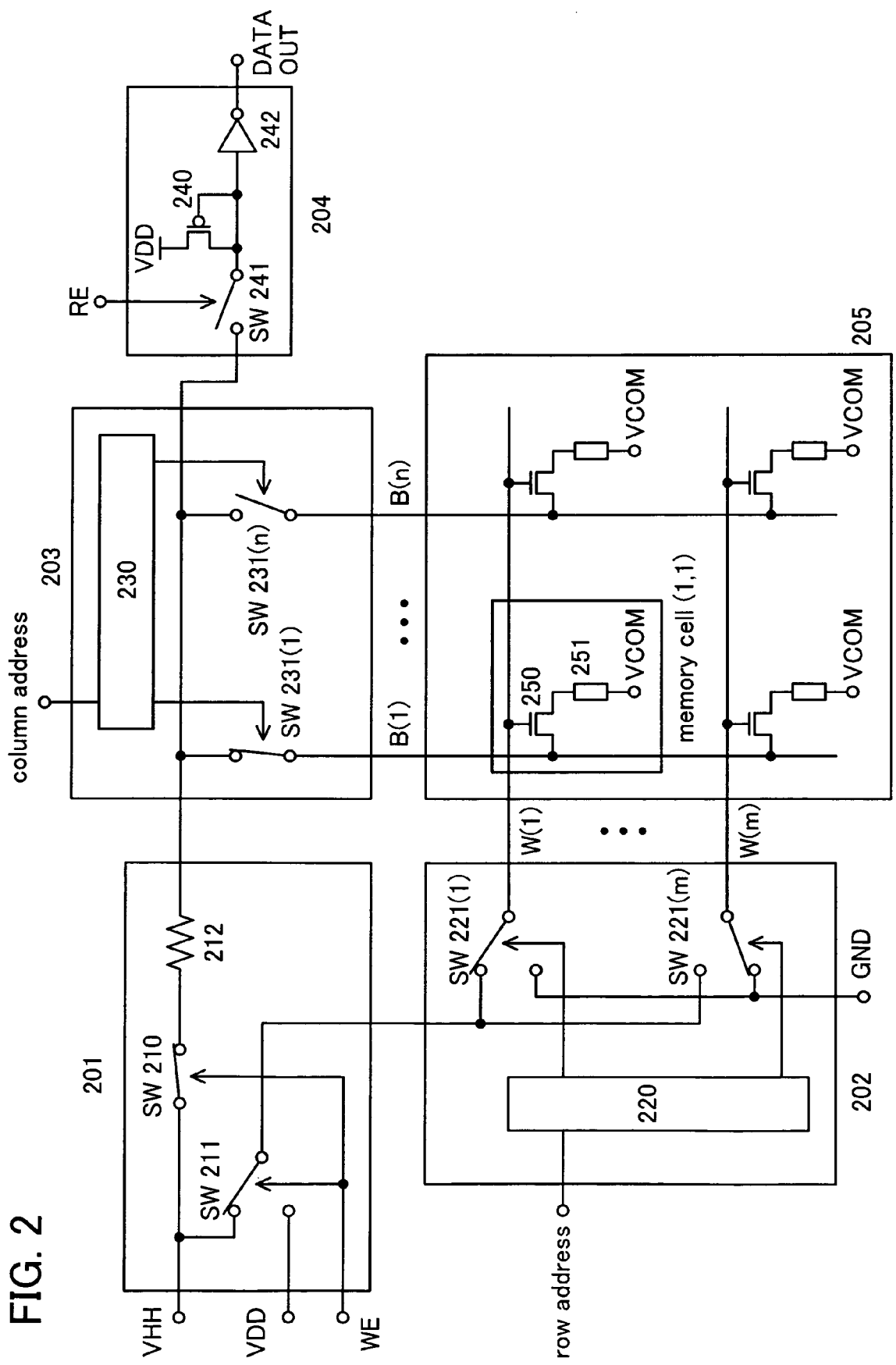
FIG. 2 describes a nonvolatile memory of the present invention.

In this embodiment mode, a structural example of a nonvolatile memory of the present invention is described using FIG. 2.

The nonvolatile memory shown in FIG. 2 has a writing circuit 201, a word line driver circuit 202, a bit line driver circuit 203, a reading circuit 204, and a memory cell array 205 including memory cells that are arranged in row m and column n.

The bit line driver circuit 203 includes a column decoder 230 and switches 231(1) to 231(n), and a column address is input thereto. In addition, the bit line driver circuit 203 is connected to the memory cell array 205 by an n number of bit lines B(1) to B(n). The bit line driver circuit 203 turns on a switch 231(k) of a column that is specified by the column address (column k), and connects a bit line B(k) to the writing circuit 201 or the reading circuit 204.

The word line driver circuit 202 includes a row decoder 220 and switches 221(1) to 221(m), and a row address is input thereto. In addition, the word line driver circuit 202 is connected to the memory cell array 205 by an m number of word lines W(1) to W(m). The word line driver circuit 202 controls the switches 221(1) to 221(m), connects a word line W(j) of a row that is specified by the row address (row j) to the writing circuit 201, and connects a word line of another row to a grounding power source line.

Note that the nonvolatile memory shown in FIG. 2 shows a state in which a memory cell (1, 1) is selected.

Memory cells (j, k) (j is an integer from 1 to m, and k is an integer from 1 to n) each include a transistor 250 and a memory element 251. A gate electrode of the transistor 250 is connected to the word line W(j), one of a source electrode and drain electrode of the transistor 250 is connected to the bit line B(k), and the other of the source electrode and drain electrode is connected to a first electrode of the memory element 251. In addition, a common potential VCOM is supplied to a second electrode of the memory element.

An example of an anti-fuse type memory element is described as the memory element 251. Note that here, by applying a predetermined voltage to the memory element 251, the memory element transitions from a high resistance state (effective resistance RH) to a low resistance state (effective resistance RL) to perform a writing operation.

The writing circuit 201 includes a switch 210, a switch 211, and a resistance element 212, and a power source potential VHH for writing, a power source potential VDD, and a writing control signal WE are input. When the signal WE is asserted, the switch 210 is turned on and the potential VHH is supplied to the bit line driver circuit 203 through the resistance element 212. In addition, by the switch 211, the potential VHH is supplied to the word line driver circuit 202. On the other hand, when the signal WE is de-asserted, the switch 210 is turned off, and the potential VHH is not supplied to the bit line driver circuit 203. In addition, by the switch 211, the potential VDD is supplied to the word line driver circuit 202.

The reading circuit 204 includes a switch 241, a transistor 240, and an inverter 242, a reading control signal RE is input, and a signal DATA OUT is output. When the signal RE is asserted, the switch 241 is turned on, and the transistor 240 is electrically connected to the bit line driver circuit 203. As a result, a current in accordance with a state of a memory element in a selected memory cell is input to the reading circuit 204, and a potential of the signal DATA OUT is determined.

If the memory element in the selected memory cell is in a low resistance state, a current that flows into the memory element becomes large, and a voltage drop at the transistor 240 also becomes large. Accordingly, an input voltage to the inverter 242 becomes lower than a threshold potential of the inverter. As a result, a potential of the signal DATA OUT becomes VDD. On the other hand, if the memory element in the selected memory cell is in a high resistance state, the current that flows into the memory element becomes small, and the voltage drop at the transistor 240 also becomes small. Accordingly, the input potential to the inverter 242 becomes higher than the threshold potential of the inverter. As a result, the potential of the signal DATA OUT becomes GND. In this manner, by generation of the data signal DATA OUT based on a state of the memory element, whether the memory element is in a low resistance state or a high resistance state can be read.

Note that when the signal RE is de-asserted, the switch 241 is turned off, and reading of the memory cell is not performed.

The nonvolatile memory of the present invention includes a resistance element 212. The resistance element 212 can reduce current consumption during writing without affecting a reading operation. This will be described below.

The signal WE is asserted and the signal RE is de-asserted during writing. The bit line driver circuit 203 selects a column (column k) based on a column address, and supplies the potential VHH supplied from the writing circuit 201 to the bit line B(k). The word line driver circuit 202 selects a row (row j) based on a row address, and supplies the potential VHH supplied from the writing circuit 201 to the word line W(j). Then, writing is performed for a selected memory cell.

In a writing operation, a current flows into a pathway of the switch 210, the resistance element 212, the switch 231, the transistor 250, and the memory element 251. By having the resistance element 212 in this current pathway, current consumption can be reduced. A resistance of the resistance element 212 is preferably that which is smaller than the resistance RH of the memory element in a high resistance state and larger than the resistance RL in a low resistance state. In particular, a resistance that is less than or equal to $\frac{1}{3}$ of the resistance RH of the memory element in a high resistance state, preferably less than or equal to $\frac{1}{10}$, and that which is more than or equal to the resistance RL in a low resistance state, preferably more than or equal to 3 times, is used for the resistance element 212. By using such a resistance element 212, a rise in the power source potential VHH for writing can be suppressed, as well as reduce current consumption when the memory element transitions from a high resistance state to a low resistance state. As a result, current consumption during writing can be reduced.

On the other hand, the signal RE is asserted and the signal WE is de-asserted during reading. The bit line driver circuit 203 selects a column (column k) based on a column address, and connects the reading circuit 204 and the bit line B(k). The word line driver circuit 202 selects a row (row j) based on a row address, and supplies the potential VDD supplied from the writing circuit 201 to the word line W(j). Then, reading is performed for a selected memory cell.

In a reading operation, a current flows into a pathway of the transistor 240, the switch 241, the switch 231, the transistor 250, and the memory element 251. Since the resistance element 212 does not exist in this current pathway, the resistance element 212 does not affect the reading operation.

Note that it is acceptable as long as the resistance element 212 is proved in a pathway of a current that flows into the memory element 251 during writing, and preferably not in a pathway of a current that flows into the memory element during reading. However, as described in Embodiment Mode 1, in the case where the resistance element 212 is provided in the pathway of the current that flows into the memory element 251 during reading, reading can be performed by providing a reading circuit that takes into consideration the resistance element 212.

For the resistance element 212, a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Accordingly, by the present invention, a nonvolatile memory with reduced current consumption during writing can be realized.

Note that this embodiment mode can be appropriately combined with another embodiment mode or an embodiment to be described below.

Embodiment Mode 3

In this embodiment mode, a structural example of a nonvolatile memory of the present invention is described with reference to FIG. 3.

Figure 3:
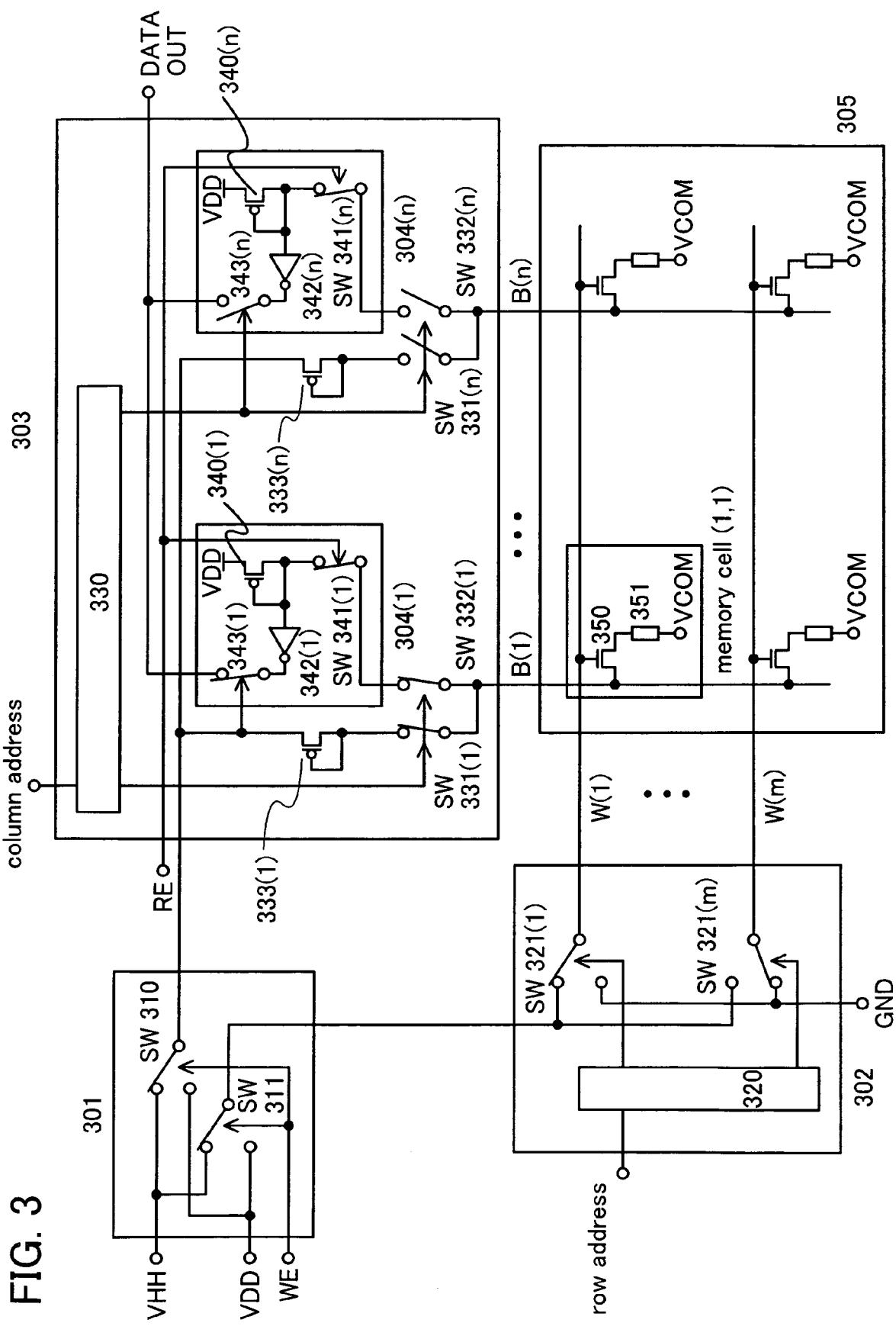
FIG. 3 describes a nonvolatile memory of the present invention.

The nonvolatile memory shown in FIG. 3 includes a writing circuit 301, a word line driver circuit 302, a bit line driver circuit 303, and a memory cell array 305 including memory cells that are arranged in row m and column n. Note that a reading circuit is included in the bit line driver circuit 303.

The bit line driver circuit 303 includes a column decoder 330, switches 331(1) to 331(n), switches 332(1) to 332(n), resistance elements 333(1) to 333(n) each composed of a diode-connected transistor, and reading circuits 304(1) to 304(n). A column address is input to the bit line driver circuit 303. In addition, the bit line driver circuit 303 is connected to the memory cell array 305 by an n number of bit lines B(1) to B(n). The bit line driver circuit 303 turns on a switch 331(k) and a switch 332(k) of a column (column k) that is specified by the column address, and connects the bit line B(k) to a reading circuit 304(k) and to the writing circuit 301 through a resistance element 333(k). In addition, the bit line driver circuit 303 turns on a switch 343(k) in the reading circuit 304(k) and selects the reading circuit 304(k).

The word line driver circuit 302 includes a row decoder 320 and switches 321(1) to 321(m), and a row address is input thereto. In addition, the word line driver circuit 302 is connected to the memory cell array 305 by an m number of word lines W(1) to W(m). The word line driver circuit 302 controls the switches 321(1) to 321(m), connects a word line W(j) of a row (row j) of a row that is specified by the row address to the writing circuit 301, and connects a word line of another row to a grounding power source line.

Note that the nonvolatile memory shown in FIG. 3 shows a state in which a memory cell (1, 1) is selected.

Each memory cell (j, k) (j is an integer from 1 to m, and k is an integer from 1 to n) included in the memory cell array 305 includes a transistor 350 and a memory element 351. A gate electrode of the transistor 350 is connected to the word line W(j), one of a source electrode and drain electrode of the transistor 350 is connected to the bit line B(k), and the other of the source electrode and drain electrode is connected to a first electrode of the memory element 351. In addition, a common potential VCOM is supplied to a second electrode of the memory element.

Note that an example of an anti-fuse type memory element is described as the memory element 351. Note that here, by applying a predetermined voltage to the memory element 351, the memory element transitions from a high resistance state (effective resistance RH) to a low resistance state (effective resistance RL) to perform a writing operation.

The writing circuit 301 includes a switch 310, and a switch 311, and a power source potential VHH for writing, a power source potential VDD, and a writing control signal WE are input. When the signal WE is asserted, the switch 310 is turned on and the potential VHH is supplied to the bit line driver circuit 303. In addition, by the switch 311, the potential VHH is supplied to the word line driver circuit 302. On the other hand, when the signal WE is de-asserted, the switch 310 is turned off, and a potential is not supplied to the bit line driver circuit 303. In addition, by the switch 311, the potential VDD is supplied to the word line driver circuit 302.

The reading circuits 304(1) to 304(n) include switches 341(1) to 341(n), transistors 340(1) to 340(n), inverters 342(1) to 342(n), and switches 343(1) to 343(n), respectively. The reading control signal RE and an output signal of the column decoder 330 are input to, and a signal DATA OUT is output from each of the reading circuits 304(1) to 304(n). When the signal RE is asserted, the switches 341(1) to 341(n) are turned on. In addition, the reading circuit 304(k) of a column (column k) that is specified by the column address is connected to the bit line B(k), a current in accordance with a state of a selected memory cell flows into the transistor 340(k), and an output potential of an inverter 342(k) is determined. At the same time, a switch 343(k) is turned on, and the signal DATA OUT is output. Using this signal DATA OUT, a state of the memory element can be read.

Note that in the case that the signal RE is de-asserted, the switches 341(1) to 341(n) are turned off, and reading of a memory cell is not performed.

The nonvolatile memory of the present invention includes the resistance elements 333(1) to 333(n). The resistance elements 333(1) to 333(n) can reduce current consumption during reading without affecting reading. This will be described below.

The signal WE is asserted and the signal RE is de-asserted during writing. The bit line driver circuit 303 selects a column (column k) based on a column address, and supplies the potential VHH supplied from the writing circuit 301 to the bit line B(k). The word line driver circuit 302 selects a row (row j) based on a row address, and supplies the potential VHH supplied from the writing circuit 301 to the word line W(j). Then, writing is performed for a selected memory cell.

In a writing operation, a current flows into a pathway of the switch 310, the resistance element 333(k), the switch 331(k), the transistor 350, and the memory element 351. By having the resistance element 333(k) in this current pathway, current consumption can be reduced. A resistance of the resistance element 333(k) is preferably that which is smaller than the resistance RH of the memory element in a high resistance state and larger than the resistance RL in a low resistance state. In particular, a resistance that is less than or equal to ⅓ of the resistance RH of the memory element in a high resistance state, preferably less than or equal to 1/10, and that which is more than or equal to the resistance RL in a low resistance state, preferably more than or equal to 3 times, is used for the resistance element 333(k). By using such a resistance element 333(k), a rise in the power source potential VHH for writing can be suppressed, as well as reduce current consumption when the memory element transitions from a high resistance state to a low resistance state. As a result, current consumption during writing can be reduced.

On the other hand, the signal RE is asserted and the signal WE is de-asserted during reading. The bit line driver circuit 303 selects a column (column k) based on a column address, and connects the reading circuit 304(k) and the bit line B(k). The word line driver circuit 302 selects a row (row j) based on a row address, and supplies the potential VDD supplied from the writing circuit 301 to the word line W(j). Then, reading is performed for a selected memory cell.

In a reading operation, a current flows into a pathway of the transistor 340(k), the switch 341(k), the switch 332(k), the transistor 350, and the memory element 351. Since the resistance element 333(k) does not exist in this current pathway, the resistance element 333(k) does not affect the reading operation.

Note that as in this embodiment mode, by providing a reading circuit for each bit line, a lead wiring from the memory element 351 to the reading circuit can be made to be short; accordingly, parasitic resistance or parasitic capacitance of the wiring can be reduced. As a result, reading speed can be improved. In addition, although the potential that is input to the inverter 342(k) changes in accordance with a state of the memory element, since parasitic resistance or parasitic capacitance can be reduced by making the lead wiring short, reduction of a potential difference before and after the change can be controlled. Therefore, a reading operation can be stabilized. Here, although a reading circuit is provided for each bit line, the number of bit lines per reading circuit is not particularly limited.

Note that it is acceptable as long as the resistance element 333(k) is proved in a pathway of a current that flows into the memory element 351 during writing, and preferably not in a pathway of a current that flows into the memory element during reading. However, as described in Embodiment Mode 1, in the case where the resistance element 333(k) is provided in the pathway of the current that flows into the memory element 351 during reading, reading can be performed by providing a reading circuit that takes into consideration the resistance element 333(k).

For the resistance element 333(k), a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Accordingly, by the present invention, a nonvolatile memory with reduced current consumption during writing can be realized.

Note that this embodiment mode can be appropriately combined with another embodiment mode or an embodiment to be described below.

Embodiment Mode 4

Figure 4:
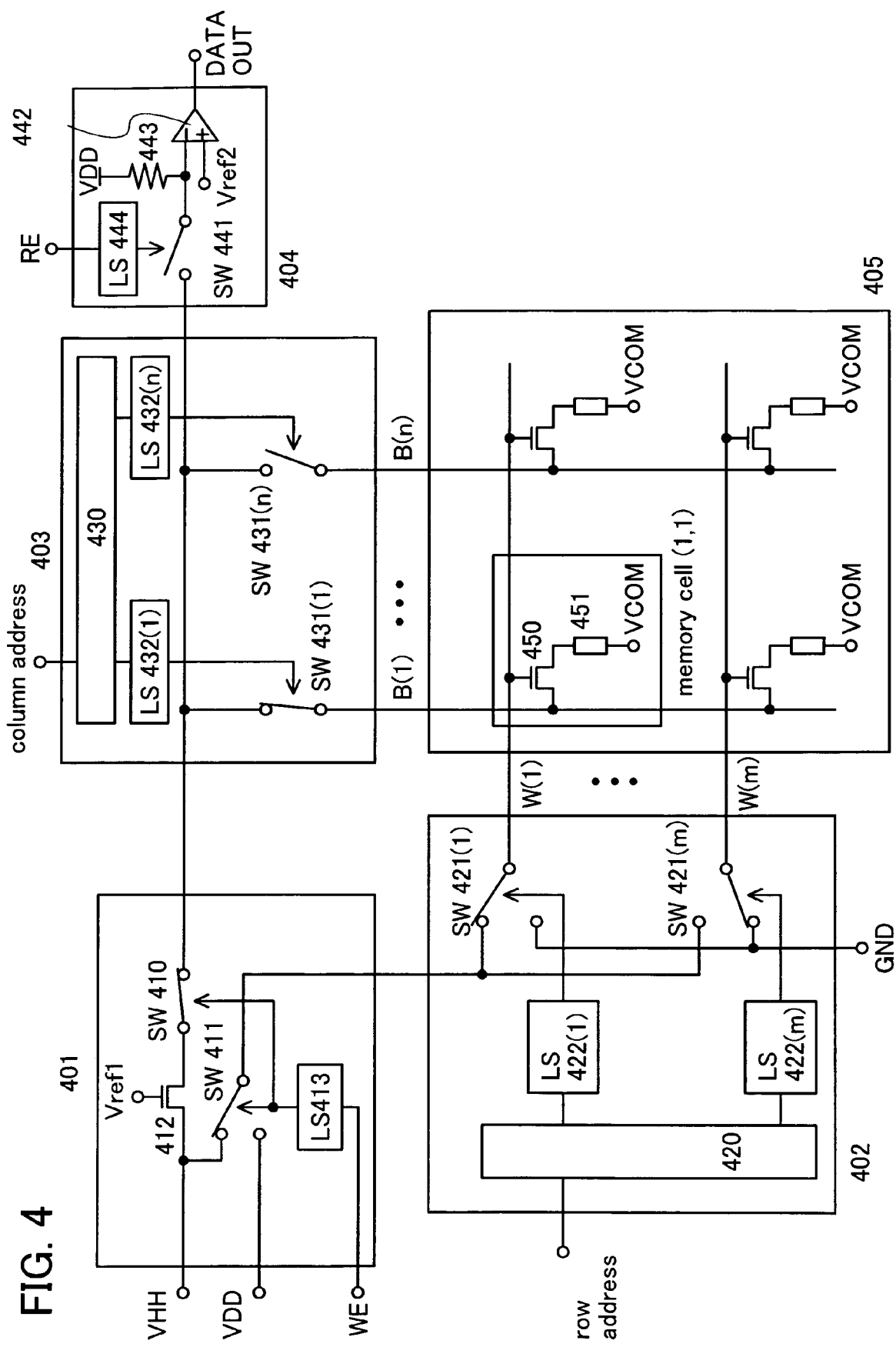
FIG. 4 describes a nonvolatile memory of the present invention.

In this embodiment mode, a structural example of a nonvolatile memory of the present invention is described using FIG. 4.

The nonvolatile memory shown in FIG. 4 has a writing circuit 401, a word line driver circuit 402, a bit line driver circuit 403, a reading circuit 404, and a memory cell array 405 including memory cells that are arranged in row m and column n.

The bit line driver circuit 403 includes a column decoder 430, switches 431(1) to 431(n), and level shifters 432(1) to 432(n), and a column address is input thereto. In addition, the bit line driver circuit 403 is connected to the memory cell array 405 by an n number of bit lines B(1) to B(n). Each of the level shifters 432(1) to 432(n) is a circuit that increases an amplitude of an output signal from the column decoder 430, so that an amplitude of a control signal that is input to each of the switches 431(1) to 431(n) is greater than or equal to an amplitude of a potential that is supplied to the bit line driver circuit 403 from the writing circuit 401. By increasing the amplitude of the output signal of the column decoder 430, control of the switches 431(1) to 431(n) can be performed with certainty.

The bit line driver circuit 403 turns on a switch 431(k) of a column (column k) that is specified by the column address, and connects a bit line (k) to the writing circuit 401 or the reading circuit 404.

The word line driver circuit 402 includes a row decoder 420, switches 421(1) to 421(m), and level shifters 422(1) to 422(m), and a row address is input thereto. In addition, the word line driver circuit 402 is connected to the memory cell array 405 by an m number of word lines W(1) to W(m). Each of the level shifters 422(1) to 422(m) is a circuit that increases an amplitude of an output signal from the row decoder 420, so that an amplitude of a control signal that is input to each of the switches 421(1) to 421(m) is greater than or equal to an amplitude of a potential that is supplied to the word line driver circuit 402 from the writing circuit 401. By increasing the amplitude of the output signal of the row decoder 420, control of the switches 421(1) to 421(m) can be performed with certainty. The word line driver circuit 402 controls the switches 421(1) to 421(m), connects a word line W(j) of a row (row j) that is specified by the row address to the writing circuit 401, and connects a word line of another row to a grounding power source line.

Note that the nonvolatile memory shown in FIG. 4 shows a state in which a memory cell (1, 1) is selected.

Each memory cell (j, k) (j is an integer from 1 to m, and k is an integer from 1 to n) included in the memory cell array 405 includes a transistor 450 and a memory element 451. A gate electrode of the transistor 450 is connected to the word line W(j), one of a source electrode and drain electrode of the transistor 450 is connected to the bit line B(k), and the other of the source electrode and drain electrode is connected to a first electrode of the memory element 451. In addition, a common potential VCOM is supplied to a second electrode of the memory element 451.

An example of an anti-fuse type memory element is described as the memory element 451. Note that here, by applying a predetermined voltage to the memory element 451, the memory element transitions from a high resistance state (effective resistance RH) to a low resistance state (effective resistance RL) to perform a writing operation.

The writing circuit 401 includes a switch 410, a switch 411, a resistance element 412 composed of a transistor in which a potential Vref1 is applied to a gate electrode, and a level shifter 413. The power source potential VHH for writing, the power source potential VDD, and the control signal WE for writing are input to the writing circuit 401. The level shifter 413 is a circuit that increases an amplitude of the signal WE, so that the amplitude of the WE signal that is input to the switch 410 and the switch 411 is greater than or equal to an amplitude of a potential that is input from a high potential input terminal of the writing circuit 401. By increasing the amplitude of the signal WE, control of the switch 410 and the switch 411 can be performed with certainty.

In the case where the signal WE is asserted, the switch 410 is turned on, the potential VHH is supplied to the bit line driver circuit 403 through the resistance element 412. In addition, by the switch 411, the potential VHH is supplied to the word line driver circuit 402 through the resistance element 412. On the other hand, in the case where the signal WE is de-asserted, the switch 410 is turned off, and a potential is not supplied to the bit line driver circuit 403. In addition, by the switch 411, the potential VDD is supplied to the word line driver circuit 402.

The reading circuit 404 includes switch 441, a sense amplifier 442, a resistance element 443, and a level shifter 444. The reading control signal RE is input to and the signal DATA OUT is output from the reading circuit 404. The level shifter 444 is a circuit that increases an amplitude of the signal RE so that an amplitude of the signal RE that is input to the switch 441 is greater than or equal to an amplitude of a potential that is supplied to the bit line driver circuit 403 from the writing circuit 401. Accordingly, by increasing the amplitude of the signal RE, control of the switch 441 can be performed with certainty, and the potential that is supplied from the writing circuit 401 can be blocked with more certainty. In the case where the signal RE is asserted, the switch 441 is turned on, and the resistance element 443 is electrically connected to the bit line driver circuit 403. As a result, a current in accordance with a state of a memory element in a selected memory cell flows, and a potential that is input to the sense amplifier 442 is determined. In accordance with a magnitude correlation between the potential and a potential Vref2, a potential of the signal DATA OUT is determined.

If the memory element in the selected memory cell is in a low resistance state, a current that flows into the memory element becomes large, and a voltage drop at the resistance element 443 also becomes large. Accordingly, an input potential to the sense amplitude 442 becomes lower than the potential Vref2. As a result, a potential of the signal DATA OUT becomes VDD. On the other hand, if the memory element in the selected memory is in a high resistance state, a current that flows into the memory element becomes small, and the voltage drop at the resistance element 443 also becomes small. As a result, the potential of the signal DATA OUT becomes GND. In this manner, by generating the date signal DATA OUT based on the state of the memory element, whether the memory element is in a low resistance state or a high resistance state can be read.

Note that in the case where the signal RE is de-asserted, the switch 441 is turned off and reading of the memory cell is not performed.

The nonvolatile memory of the present invention includes the resistance element 412. The resistance element 412 can reduce current consumption during writing, without affecting a reading operation. This is described below.

The signal WE is asserted and the signal RE is de-asserted during writing. The bit line driver circuit 403 selects a column (column k) based on a column address, and supplies the potential VHH supplied from the writing circuit 401 to the bit line B(k). The word line driver circuit 402 selects a row (row j) based on a row address, and supplies the potential VHH supplied from the writing circuit 401 to the word line W(j). Then, writing is performed for a selected memory cell.

In a writing operation, a current flows into a pathway of the resistance element 412, the switch 410, the switch 431(k), the transistor 450, and the memory element 451. By having the resistance element 412 in this current pathway, current consumption can be reduced. A resistance of the resistance element 412 is preferably that which is smaller than the resistance RH of the memory element in a high resistance state and larger than the resistance RL in a low resistance state. In particular, a resistance that is less than or equal to ⅓ of the resistance RH of the memory element in a high resistance state, preferably less than or equal to ¹⁄₁₀, and that which is more than or equal to the resistance RL in a low resistance state, preferably more than or equal to 3 times, is used for the resistance element 412. By using such a resistance element 412, a rise in the power source potential VHH for writing can be suppressed, as well as reduce current consumption when the memory element transitions from a high resistance state to a low resistance state. As a result, current consumption during writing can be reduced.

Note that although the resistance element 412 is also connected to a pathway for applying a voltage to the word line W(j), since almost no current flows into this pathway, the resistance element 412 does not affect an operation of the word line W(j).

On the other hand, the signal RE is asserted and the signal WE is de-asserted during reading. The bit line driver circuit 403 selects a column (column k) based on a column address, and connects the reading circuit 404 and the bit line B(k). The word line driver circuit 402 selects a row (row j) based on a row address, and supplies the potential VDD supplied from the writing circuit 401 to the word line W(j). Then, reading is performed for a selected memory cell.

In a reading operation, a current flows into a pathway of the resistance element 443, the switch 441, the switch 431(k), the transistor 450, and the memory element 451. Since the resistance element 412 does not exist in this current pathway, the resistance element 412 does not affect the reading operation.

Note that it is acceptable as long as the resistance element 412 is proved in a pathway of a current that flows into the memory element 451 during writing, and preferably not in a pathway of a current that flows into the memory element during reading. However, as described in Embodiment Mode 1, in the case where the resistance element 412 is provided in the pathway of the current that flows into the memory element 451 during reading, reading can be performed by providing a reading circuit that takes into consideration the resistance element 412.

Note that for the resistance element 412, a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Accordingly, by the present invention, a nonvolatile memory with reduced current consumption during writing can be realized.

Note that this embodiment mode can be appropriately combined with another embodiment mode or an embodiment to be described below.

Embodiment Mode 5

Figure 5:
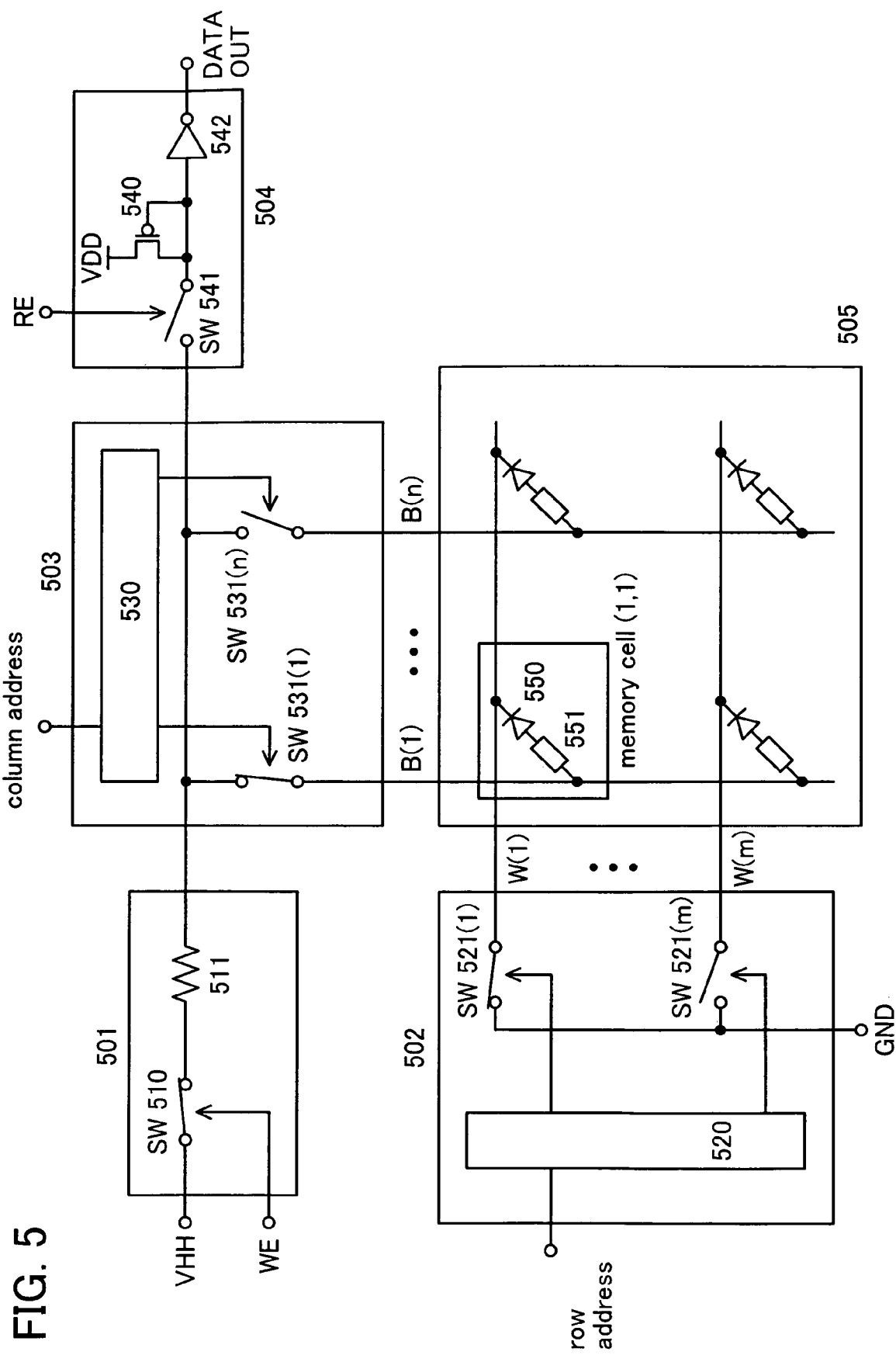
FIG. 5 describes a nonvolatile memory of the present invention.

In this embodiment mode, a structural example of a nonvolatile memory of the present invention is described using FIG. 5.

The nonvolatile memory shown in FIG. 5 has a writing circuit 501, a word line driver circuit 502, a bit line driver circuit 503, a reading circuit 504, and a memory cell array 505 composed of memory cells that are arranged in row m and column n.

The bit line driver circuit 503 includes a column decoder 530 and switches 531(1) to 531(n), and a column address is input thereto. In addition, the bit line driver circuit 503 is connected to the memory cell array 505 by an n number of bit lines B(1) to B(n). The bit line driver circuit 503 turns on a switch 531(k) of a column that is specified by the column address (column k), and connects a bit line B(k) to the writing circuit 501 or the reading circuit 504.

The word line driver circuit 502 includes a row decoder 520 and switches 521(1) to 521(m), and a row address is input thereto. In addition, the word line driver circuit 502 is connected to the memory cell array 505 by an m number of word lines W(1) to W(m). The word line driver circuit 502 turns on a switch 521(j) of a row (row j) that is specified by the row address and connects the word line W(j) to a grounding power source line.

Note that the nonvolatile memory shown in FIG. 5 shows a state in which a memory cell (1, 1) is selected.

Each memory cell (j, k) (j is an integer from 1 to m, and k is an integer from 1 to n) included in the memory cell array 505 includes a diode 550 and a memory element 551. Here, a case where an anti-fuse type memory element is used as the memory element 551 is described. Note that writing to the memory element 551 can be performed by applying a predetermined voltage to cause transition form a high resistance state (effective resistance of RH) to a low resistance state (effective resistance of RL).

The diode 550 and the memory element 551 are connected in series, the memory element 551 is connected to the bit line B(k), and the diode 550 is connected to the word line W(j) so that a current flows towards the word line W(j).

Note that the order of connection of the diode 550 and the memory element 551 may be reversed. That is, the memory element 551 may be connected to the word line W(j) and the diode may be connected to the bit line B(k) so that a current flows towards the word line W(j).

In addition, the diode 550 is not limited to being provided so that a current flows towards the word line W(j). The diode 550 may be provided so as to match a direction of a current that flows into the memory element 551, when writing is performed in the memory element 551.

The writing circuit 501 includes a switch 510, and a resistance element 511, and the power source potential VHH for writing and the writing control signal WE are input. When the signal WE is asserted, the switch 510 is turned on and the potential VHH is supplied to the bit line driver circuit 503 through the resistance element 511. On the other hand, when the signal WE is de-asserted, the switch 510 is turned off, and the potential VHH is not supplied to the bit line driver circuit 503.

The reading circuit 504 includes a switch 541, a transistor 540, and an inverter 542. The reading control signal RE is input to and the signal DATA OUT is output to the reading circuit 504. In the case where the signal RE is asserted, the switch 541 is turned on, and the transistor 540 is electrically connected to the bit line driver circuit 503. As a result, a current in accordance with a state of a memory element in a selected memory cell flows, and a potential of the signal DATA OUT is determined. On the other hand, in the case where the signal RE is de-asserted, the switch 241 is turned off, and reading of the memory cell is not performed.

The nonvolatile memory of the present invention includes a resistance element 511. The resistance element 511 can reduce current consumption during writing without affecting a reading operation. This will be described below.

The signal WE is asserted and the signal RE is de-asserted during writing. The bit line driver circuit 503 selects a column (column k) based on a column address, and supplies the potential VHH supplied from the writing circuit 501 to the bit line B(k). The word line driver circuit 502 selects a row (row j) based on a row address, and supplies a grounding potential GND to the word line W(j). Then, writing is performed for a selected memory cell.

In a writing operation, a current flows into a pathway of the switch 510, the resistance element 511, the switch 531, the memory element 551, the diode 550, and the switch 521. By having the resistance element 511 in this current pathway, current consumption can be reduced. A resistance of the resistance element 511 is preferably that which is smaller than the resistance RH of the memory element in a high resistance state and larger than the resistance RL in a low resistance state. In particular, a resistance that is less than or equal to ⅓ of the resistance RH of the memory element in a high resistance state, preferably less than or equal to ¹⁄₁₀, and that which is more than or equal to the resistance RL in a low resistance state, preferably more than or equal to 3 times, is used for the resistance element 511. By using such a resistance element 511, a rise in the power source potential VHH for writing can be suppressed, as well as reduce current consumption when the memory element transitions from a high resistance state to a low resistance state. As a result, current consumption during writing can be reduced.

On the other hand, the signal RE is asserted and the signal WE is de-asserted during reading. The bit line driver circuit 503 selects a column (column k) based on a column address, and connects the reading circuit 504 and the bit line B(k). The word line driver circuit 502 selects a row (row j) based on a row address, and supplies the grounding potential GND to the word line W(j). Then, reading is performed for a selected memory cell.

In a reading operation, a current flows into a pathway of the transistor 540, the switch 541, the switch 531, the memory element 551, and the diode 550. Since the resistance element 511 does not exist in this current pathway, the resistance element 511 does not affect the reading operation.

Note that it is acceptable as long as the resistance element 511 is proved in a pathway of a current that flows into the memory element 551 during writing, and preferably not in a pathway of a current that flows into the memory element during reading. However, as described in Embodiment Mode 1, in the case where the resistance element 511 is provided in the pathway of the current that flows into the memory element 551 during reading, reading can be performed by providing a reading circuit that takes into consideration the resistance element 511.

Note that for the resistance element 511, a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Accordingly, by the present invention, a nonvolatile memory with reduced current consumption during writing can be realized.

Note that this embodiment mode can be appropriately combined with another embodiment mode or an embodiment to be described below.

Embodiment Mode 6

Figure 6:
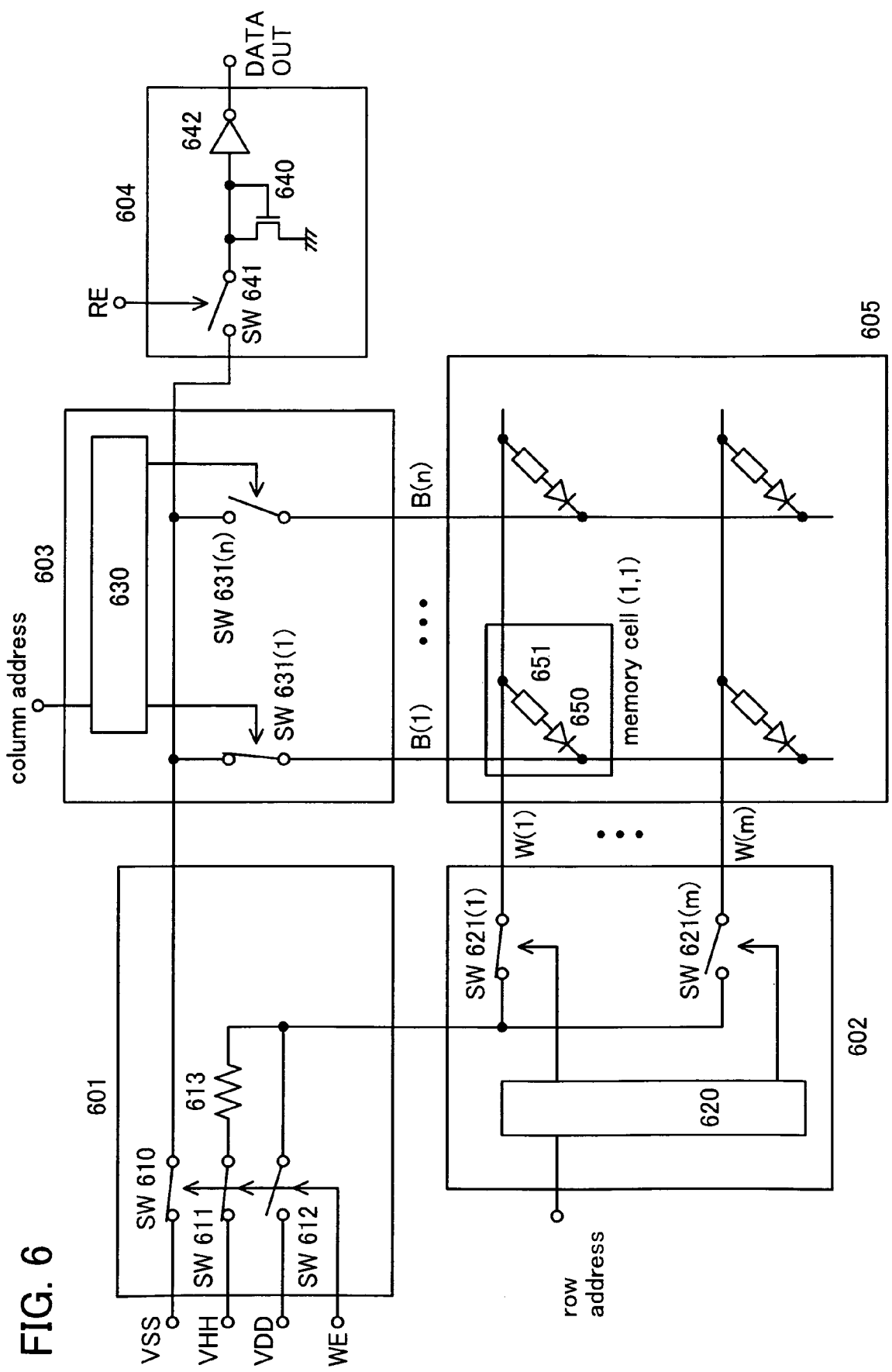
FIG. 6 describes a nonvolatile memory of the present invention.

In this embodiment mode, a structural example of a nonvolatile memory of the present invention is described using FIG. 6.

The nonvolatile memory shown in FIG. 6 has a writing circuit 601, a word line driver circuit 602, a bit line driver circuit 603, a reading circuit 604, and a memory cell array 605 including memory cells that are arranged in row m and column n.

The bit line driver circuit 603 includes a column decoder 630 and switches 631(1) to 631(*n*), and a column address is input thereto. In addition, the bit line driver circuit 603 is connected to the memory cell array 605 by an n number of bit lines B(1) to B(n). The bit line driver circuit 603 turns on a switch 631(*k*) of a column that is specified by the column address (column k), and connects a bit line B(k) to the writing circuit 601 or the reading circuit 604.

The word line driver circuit 602 includes a row decoder 620 and switches 621(1) to 621(*m*), and a row address is input thereto. In addition, the word line driver circuit 602 is connected to the memory cell array 605 by an m number of word lines W(1) to W(m). The word line driver circuit 602 turns on a switch 621(*i*) of a row that is specified by the row address (row j), and connects the word line W(j) to the writing circuit 601.

Note that the nonvolatile memory shown in FIG. 6 shows a state in which a memory cell (1, 1) is selected.

Each memory cell (j, k) (j is an integer from 1 to m, and k is an integer from 1 to n) included in the memory cell array 605 includes a diode 650 and a memory element 651. Here, a case where an anti-fuse type memory element is used as the memory element 651 is described. Note that writing to the memory element 651 can be performed by applying a predetermined voltage to cause transition form a high resistance state (effective resistance of RH) to a low resistance state (effective resistance of RL).

The diode 650 and the memory element 651 are connected in series, the memory element 651 is connected to the word line W(k), and the diode 650 is connected to the bit line B(k) so that a current flows towards the bit line B(k).

Note that the order of connection of the diode 650 and the memory element 651 may be reversed. That is, the memory element 651 may be connected to the bit line B(k) and the diode may be connected to the word line W(j) so that a current flows towards the bit line B(k).

In addition, the diode 650 is not limited to being provided so that a current flows towards the bit line B(k). The diode 650 may be provided so as to match a direction of a current that flows into the memory element 651, when writing is performed in the memory element 651.

The writing circuit 601 includes a switch 610, a switch 611, a switch 612, and a resistance element 613, and a power source potential VHH for writing, a power source potential VDD, a potential VSS, and a writing control signal WE are input. When the signal WE is asserted, the switch 610 is turned on and the potential VSS is supplied to the bit line driver circuit 603. In addition, the switch 611 is turned on and the switch 312 is turned off, and the potential VHH is supplied to the word line driver circuit 602 through the resistance element 613. On the other hand, when the signal WE is de-asserted, the switch 610 is turned off, and VHH is not supplied to the bit line driver circuit 603. In addition, the switch 611 is turned off and the switch 612 is turned on, and the potential VDD is supplied to the word line driver circuit 602.

The reading circuit 604 includes a switch 641, a transistor 640, and an inverter 642, a reading control signal RE is input, and a signal DATA OUT is output. When the signal RE is asserted, the switch 641 is turned on, and the transistor 640 is electrically connected to the bit line driver circuit 603. As a result, a current in accordance with a state of a memory element in a selected memory cell flows, and a potential of the signal DATA OUT is determined. On the other hand, when the signal RE is de-asserted, the switch 641 is turned off, and reading of the memory cell is not performed.

The nonvolatile memory of the present invention includes a resistance element 613. The resistance element 613 can reduce current consumption during writing without affecting a reading operation. This will be described below.

The signal WE is asserted and the signal RE is de-asserted during writing. The bit line driver circuit 603 selects a column (column k) based on a column address, and supplies the potential VSS supplied from the writing circuit 601 to the bit line B(k). The word line driver circuit 602 selects a row (row j) based on a row address, and supplies the potential VHH to the word line W(j). Then, writing is performed for a selected memory cell.

In a writing operation, a current flows into a pathway of the switch 611, the resistance element 613, the switch 621(j), the memory element 651, the diode 650, the switch 631(k), and the switch 610. By having the resistance element 613 in this current pathway, current consumption can be reduced. A resistance of the resistance element 613 is preferably that which is smaller than the resistance RH of the memory element in a high resistance state and larger than the resistance RL in a low resistance state. In particular, a resistance that is less than or equal to ⅓ of the resistance RH of the memory element in a high resistance state, preferably less than or equal to ⅒, and that which is more than or equal to the resistance RL in a low resistance state, preferably more than or equal to 3 times, is used for the resistance element 613. By using such a resistance element 613, a rise in the power source potential VHH for writing can be suppressed, as well as reduce current consumption when the memory element transitions from a high resistance state to a low resistance state. As a result, current consumption during writing can be reduced.

On the other hand, the signal RE is asserted and the signal WE is de-asserted during reading. The bit line driver circuit 603 selects a column (column k) based on a column address, and connects the reading circuit 604 and the bit line B(k). The word line driver circuit 602 selects a row (row j) based on a row address, and supplies the potential VDD to the word line W(j). Then, reading is performed for a selected memory cell.

In a reading operation, a current flows into a pathway of the switch 612, the switch 621(j), the memory element 651, the diode 650, the switch 631(k), the switch 641, and the transistor 640. Since the resistance element 613 does not exist in this current pathway, the resistance element 613 does not affect the reading operation.

Note that it is acceptable as long as the resistance element 613 is proved in a pathway of a current that flows into the memory element 651 during writing, and preferably not in a pathway of a current that flows into the memory element during reading. However, as described in Embodiment Mode 1, in the case where the resistance element 613 is provided in the pathway of the current that flows into the memory element 651 during reading, reading can be performed by providing a reading circuit that takes into consideration the resistance element 613.

Note that for the resistance element 613, a resistor using a semiconductor region, a resistor using a metal thin film, or a nonlinear element such as a transistor in which a gate electrode is controlled or a diode may be used.

In addition, a nonvolatile memory is not limited to the anti-fuse type nonvolatile memory as described above, and a rewritable nonvolatile memory using a memory element that has in a plurality of states including a low resistance state can be used.

Accordingly, by the present invention, a nonvolatile memory with reduced current consumption during writing can be realized.

Note that this embodiment mode can be appropriately combined with another embodiment mode or an embodiment to be described below.

Embodiment 1

Figure 7:
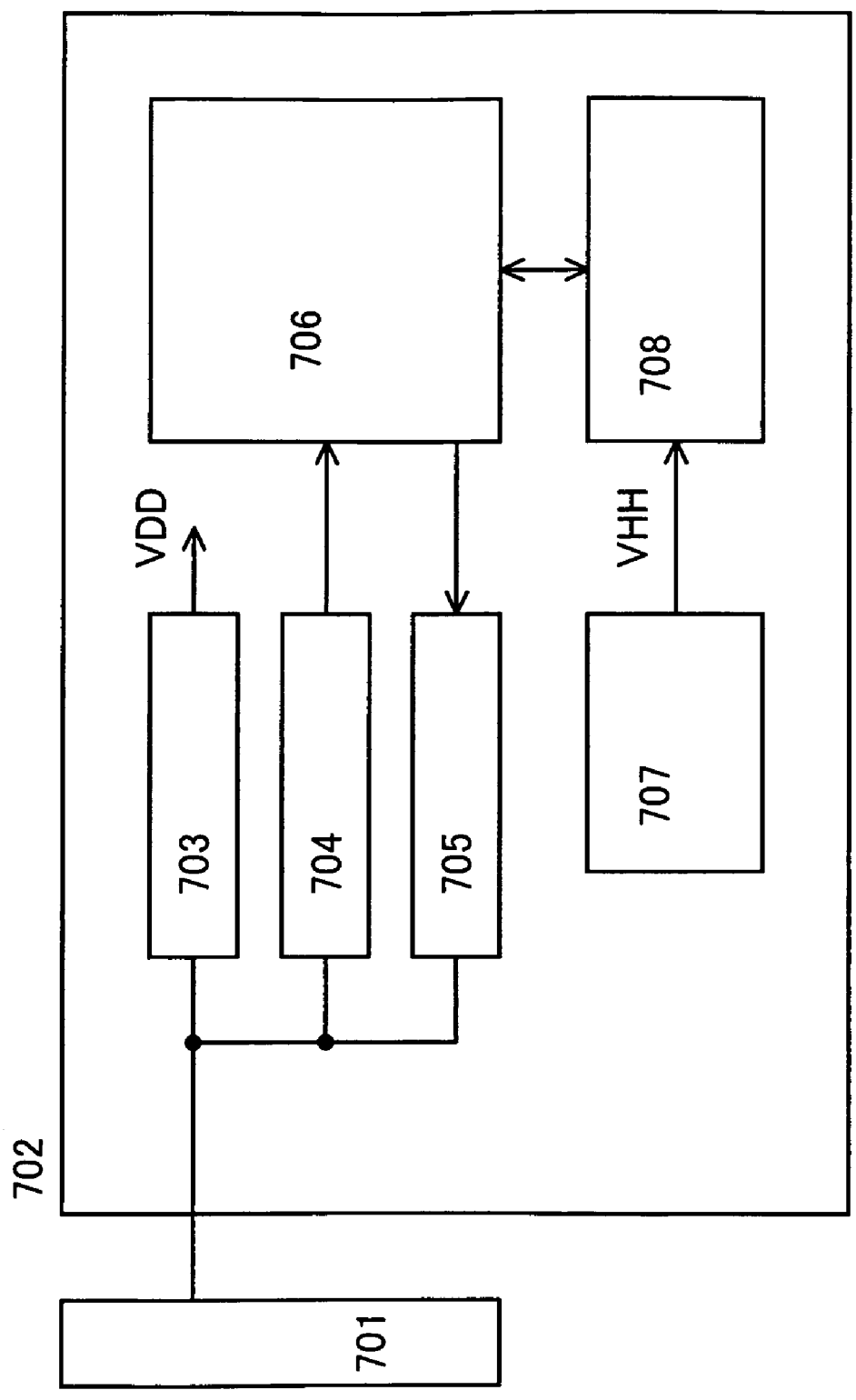
FIG. 7 describes a semiconductor device of the present invention.

In this embodiment, a structural example of a semiconductor device including a nonvolatile memory of the present invention is described in the block diagram of FIG. 7.

The semiconductor device shown in FIG. 7 is a wireless tag including an antenna 701 and an IC chip 702. The IC chip 702 includes a power source circuit 703, a demodulation circuit 704, a modulation circuit 705, a logic circuit 706, a power source circuit 707, and a nonvolatile memory 708.

The power source circuit 703 rectifies an AC signal that is input from the antenna 701, and generates a predetermined power source voltage VDD. The power source voltage VDD that is obtained is supplied to a circuit included in the IC chip 702. The demodulation circuit 704 extracts information from the AC signal input from the antenna 701 and outputs a demodulation signal. For example, in the case of amplitude modulation (ASK), a demodulation signal is generated by rectification and filtering. A modulation signal is input to the modulation circuit 705, and impedance of the IC chip 702 is changed by load modulation or the like. Accordingly, the wireless tag transmits a response signal. A clock signal and a demodulation signal are input to the logic circuit 706, and the logic circuit 706 outputs a modulation signal. In addition, the logic circuit 706 includes a decoding circuit; a command analysis portion; a checking circuit that checks consistency of received data; a memory control circuit; an output circuit that generates a modulation signal; and the like, and performs processing in accordance to a command that is received. In particular, the memory control circuit included in the logic circuit 706 controls reading and writing of the nonvolatile memory 708, or controls power source supply to the nonvolatile memory 708. The power source circuit 707 generates power that is supplied to the nonvolatile memory 708 by the potential VDD. Specifically, the power source circuit 707 includes a boosting circuit, and generates a high potential VHH that is supplied during writing. In addition, the nonvolatile memory 708 has a structure in which a resistance element is provided in a pathway of a current that flows into a memory element in a writing operation, and the nonvolatile memory described in the foregoing embodiment mode can be used, for example.

Note that for the antenna 701, an antenna of an electromagnetic induction method such as a coil antenna or a loop antenna; an antenna of an electric wave method such as a dipole antenna, a slit antenna, an inverted L antenna, or a patch antenna; or the like can be used.

In addition, "IC chip" is a generic name for a chip provided with an integrated circuit, and silicon, glass, plastic, paper, or the like can be used for a base of the integrated circuit. Further, the IC chip 702 shown in FIG. 7 may be composed of a plurality of IC chips.

Although in FIG. 7, a structure is shown in which the antenna 701 is provided outside of the IC chip 702, the structure may be that in which the antenna 701 is incorporated into the IC chip 702. In addition, a communication method may be either an electric wave method or an electromagnetic induction method.

A nonvolatile memory included in a semiconductor device of the present invention can be reduced in current consumption during writing, and be low power consuming. Accordingly, by including such a nonvolatile memory, an active-type wireless tag with a long lifetime of a battery, or a passive-type wireless tag with a wide communication range in which writing to the memory is possible, can be realized.

This embodiment can be appropriately combined with embodiment modes and other embodiments described in this specification.

Embodiment 2

In this embodiment, a structural example of a semiconductor device including a nonvolatile memory of the present invention is shown. Note that in this embodiment, an example of a semiconductor device provided with a battery is described with reference to FIG. 8.

Figure 8:
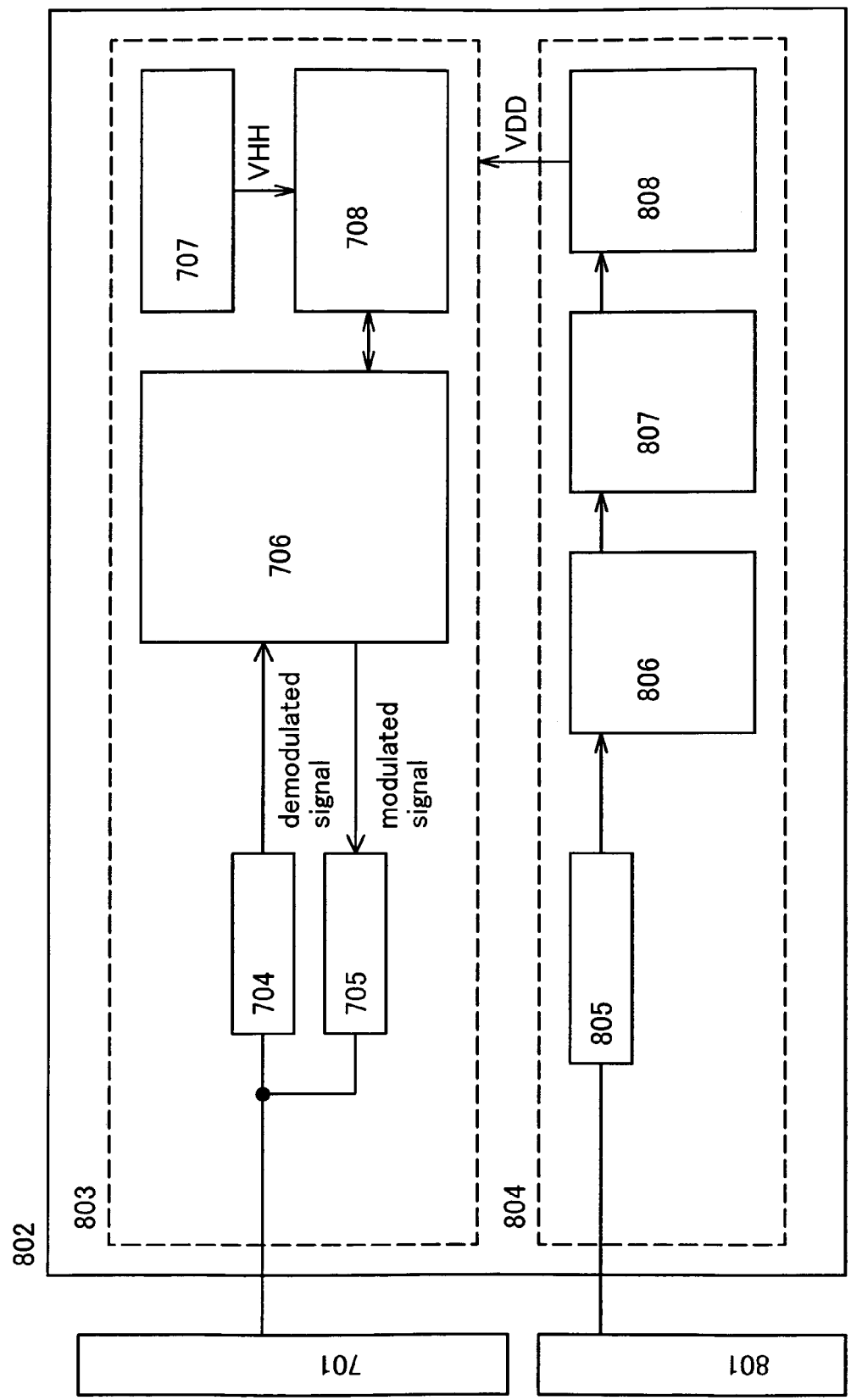
FIG. 8 describes a semiconductor device of the present invention.

The semiconductor device shown in FIG. 8 is a wireless tag including the antenna 701, an antenna 801, and a battery composed of an IC chip 802. Note that the IC chip 802 includes a signal processing portion 803 and a power supply portion 804 including a battery 807.

The power source supplying portion 804 includes a power source circuit 805, a charge control circuit 806, the battery 807, and a discharge control circuit 808. Further, the signal processing portion 803 includes the demodulation circuit 704, the modulation circuit 705, the logic circuit 706, the power source circuit 707, and the nonvolatile memory 708.

First, an operation of the power supply portion 804 is described. The power source circuit 805 rectifies an AC signal that is input from the antenna 801, and outputs a potential V1 that is smoothed. The smoothed potential V1 is input to the charge control circuit 806, and charging of the battery is started. The charge control circuit 806 may have a structure of including a voltage detection circuit, and may start charging when the potential V1 becomes more than or equal to a certain value. Further, the charge control circuit 806 may have a structure where a potential V2 of the battery is input to the charge control circuit 806 and charging is stopped when the potential V2 becomes more than or equal to a certain value, to prevent over charging of the battery.

The potential V2 of the battery is input to, and the power source voltage VDD is output from the discharge control circuit 808. The discharge control circuit 808 many have a structure of including a voltage detection circuit, and may start discharging when the potential V2 becomes more than or equal to a certain value. In addition, the structure may be that where discharging is stopped when the potential V2 becomes less than or equal to a certain value. Note that the obtained potential VDD is supplied to a circuit included in the signal processing portion 803.

Next, an operation of the signal processing portion 803 is described. The demodulation circuit 704 extracts information from the AC signal input from the antenna 701 and outputs a demodulation signal. For example, in the case of amplitude modulation (ASK), a demodulation signal is generated by extracting an envelope curve by rectification and filtering. A modulation signal is input to the modulation circuit 705, and impedance of the IC chip 802 is changed by load modulation or the like. Accordingly, the wireless tag transmits a response signal. A clock signal and a demodulation signal are input to the logic circuit 706, and the logic circuit 706 outputs a modulation signal. In addition, the logic circuit 706 includes a decoding circuit; a command analysis portion; a checking circuit that checks consistency of received data; a memory control circuit; an output circuit that generates a modulation signal; and the like, and performs processing in accordance to a command that is received. In particular, the memory control circuit included in the logic circuit 706 controls reading and writing of the nonvolatile memory 708, or controls power source supply to the nonvolatile memory 708. The power source circuit 707 generates power that is supplied to the nonvolatile memory 708 by the potential VDD. Specifically, the power source circuit 707 includes a boosting circuit, and generates a high potential VHH that is supplied during writing. In addition, the nonvolatile memory 708 has a structure in which a resistance element is provided in a pathway of a current that flows into a memory element in a writing operation, and the nonvolatile memory described in the foregoing embodiment mode can be used, for example.

Power of the signal processing portion 803 in FIG. 8 is supplied by the battery 807 through the discharge control circuit 808.

The antenna 701 has a structure in accordance with a communication standard for wireless tags. For example, in the case where a communication signal is 13.56 MHz, the antenna 701 is to be an antenna for a 13.56 MHz band (typically, a coil antenna).

At this time, the antenna 801 may also be an antenna for a 13.56 MHz band, and a frequency of an electromagnetic wave from a reader/writer for charging the battery 807 may be the same as well. In that case, by a signal for charging and a signal for communication being in the same frequency band, the antenna 801 and the antenna 701 can be unified. By commoditizing the antenna 701 and the antenna 801, a semiconductor device can be reduced in size.

Further, the antenna 801 may have a structure of receiving an electromagnetic wave that occurs randomly in the exterior. In that case, the antenna 801 takes in a faint electromagnetic wave that occurs randomly in the exterior, and performs charging of the battery 807 at little bit at a time.

Note that a battery refers to a battery that can recover an amount of time for continuous use by charging. Note that as the battery, a battery formed in a sheet form is preferably used. For example, by using a lithium polymer battery using a gel-like electrolyte; a lithium ion battery; a lithium secondary battery; or the like, reduction in size is possible. It is needless to say that the battery may be anything provided that it is a chargeable battery, and a nickel hydride battery; a nickel cadmium battery, or the like may be used, as well as a large capacity capacitor, or the like.

A nonvolatile memory included in a semiconductor device of the present invention can be reduced in current consumption during writing, and be low power consuming. Accordingly, by including such a nonvolatile memory, an active-type wireless tag with a long lifetime of a battery, or a passive-type wireless tag with a wide communication range in which writing to the memory is possible, can be realized.

Since a semiconductor device of the present invention includes a battery that is wirelessly chargeable, it is possible to further widen a communication range by using this battery for a power source. In addition, by using a nonvolatile memory of the present invention, power consumption during writing is reduced and a load of the battery is also reduced. As a result, performance improvement by size reduction of the battery and stabilization of the power source are possible.

Note that, "IC chip" is a generic name for a chip provided with an integrated circuit, and silicon, glass, plastic, paper, or the like can be used for a base of the integrated circuit. Further, the IC chip 802 shown in FIG. 8 may be composed of a plurality of IC chips.

Although in FIG. 8, a structure is shown in which the antennae 701 and 801 are provided outside of the IC chip 802, the structure may be that in which one or both of the antennae 701 and 801 is/are incorporated into the IC chip 802. In addition, a communication method may be either an electric wave method or an electromagnetic induction method.

This embodiment can be appropriately combined with embodiment modes and other embodiments described in this specification.

Embodiment 3

In this embodiment, a structural example of a semiconductor device including a nonvolatile memory of the present invention is shown. Note that in this embodiment, an example of a semiconductor device provided with a battery is described with reference to FIG. 9.

Figure 9:
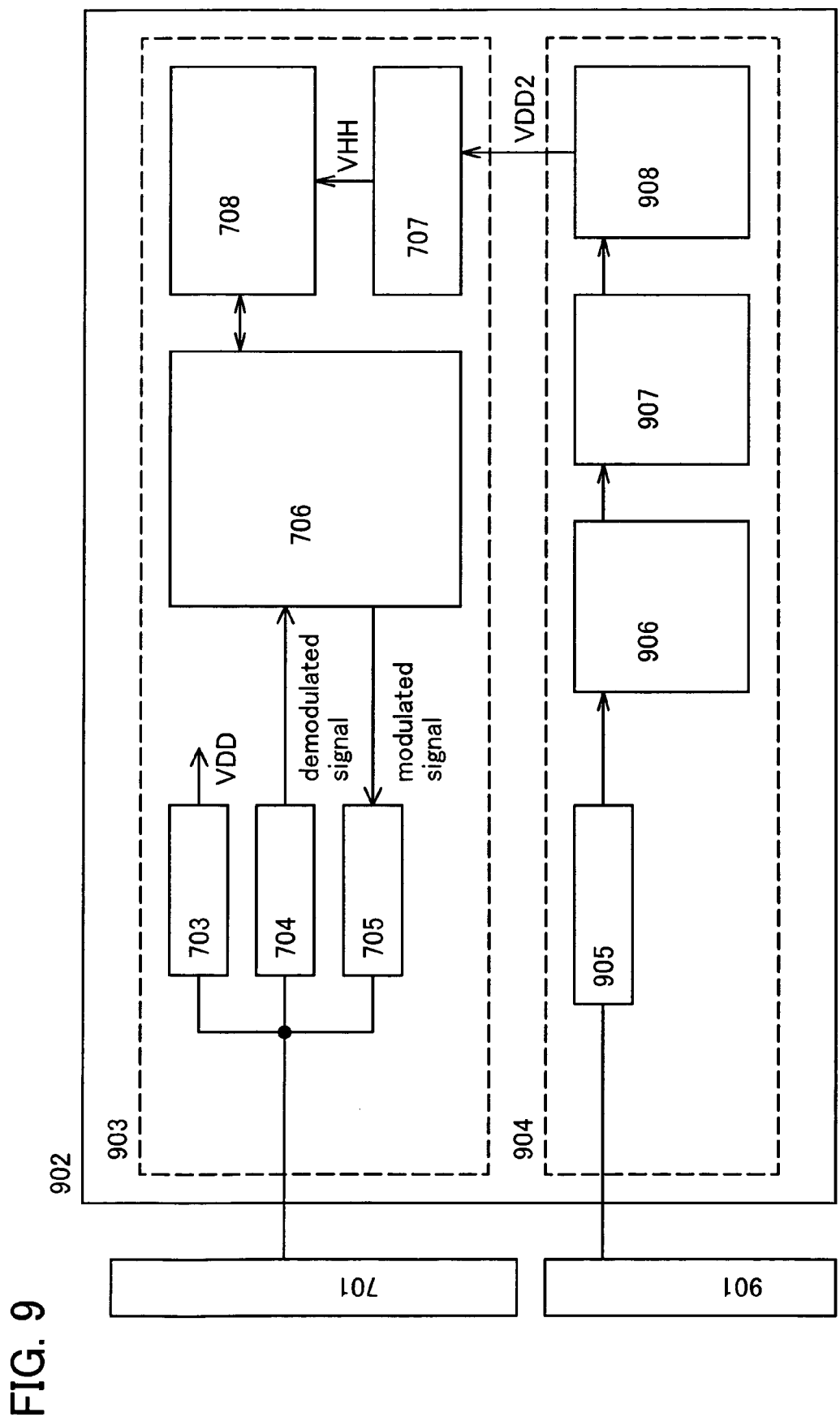
FIG. 9 describes a semiconductor device of the present invention.

The semiconductor device shown in FIG. 9 is a wireless tag including the antenna 701, an antenna 901, and a battery composed of an IC chip 902. Note that the IC chip 902 includes a signal processing portion 903 and a power supply portion 904 including a battery 907.

The power source supplying portion 904 includes a power source circuit 905, a charge control circuit 906, the battery 907, and a discharge control circuit 908. Further, the signal processing portion 903 includes the power source circuit 703, the demodulation circuit 704, the modulation circuit 705, the logic circuit 706, the power source circuit 707, and the nonvolatile memory 708.

First, an operation of the power supply portion 904 is described. The power source circuit 905 rectifies an AC signal that is input from the antenna 901, and outputs a potential V1 that is smoothed. The smoothed potential V1 is input to the charge control circuit 906, and charging of the battery is started. The charge control circuit 906 may have a structure of including a voltage detection circuit, and may start charging when the potential V1 becomes more than or equal to a certain value. Further, the charge control circuit 906 may have a structure where a potential V2 of the battery is input to the charge control circuit 906 and charging is stopped when the potential V2 becomes more than or equal to a certain value, to prevent over charging of the battery.

The potential V2 of the battery is input to, and a power source voltage VDD2 is output from the discharge control circuit 908. The discharge control circuit 908 many have a structure of including a voltage detection circuit, and may start discharging when the potential V2 becomes more than or equal to a certain value. In addition, the structure may be that where discharging is stopped when the potential V2 becomes less than or equal to a certain value. Note that by passing through the battery, the power source potential VDD2 can be a potential that is more stable than the power source potential VDD, which is generated by the power source circuit 703 described below.

Next, an operation of the signal processing portion 903 is described. The power source circuit 703 rectifies an AC signal that is input from the antenna 701, and generates a predetermined power source voltage VDD. Note that the obtained potential VDD is supplied to a circuit included in the signal processing portion 903. The demodulation circuit 704 extracts information from the AC signal input from the antenna 701 and outputs a demodulation signal. For example, in the case of amplitude modulation (ASK), a demodulation signal is generated by extracting an envelope curve by rectification and filtering. A modulation signal is input to the modulation circuit 705, and impedance of the IC chip 902 is changed by load modulation or the like. Accordingly, the wireless tag transmits a response signal. A clock signal and a demodulation signal are input to the logic circuit 706, and the logic circuit 706 outputs a modulation signal. In addition, the logic circuit 706 includes a decoding circuit; a command analysis portion; a checking circuit that checks consistency of received data; a memory control circuit; an output circuit that generates a modulation signal; and the like, and performs processing in accordance to a command that is received. In particular, the memory control circuit included in the logic circuit 706 controls reading and writing of the nonvolatile memory 708, or controls power source supply to the nonvolatile memory 708. The power source circuit 707 generates power that is supplied to the nonvolatile memory 708 by the potential VDD. Specifically, the power source circuit 707 includes a boosting circuit, and generates a high potential VHH that is supplied by the potential VDD2 during writing. In addition, the nonvolatile memory 708 has a structure in which a resistance element is provided in a pathway of a current that flows into a memory element in a writing operation, and the nonvolatile memory described in the foregoing embodiment mode can be used, for example.

Note that power source of the signal processing portion 903 is supplied by the power source circuit 703 and the power supply portion 904. Power source of the signal processing portion 903 is separated into a power source that is normally used (potential VDD) and a high potential power source (VHH) that is used only during writing in the nonvolatile memory 708. In the structure shown in FIG. 9, the potential VDD is supplied by the power source circuit 703, and the potential VHH is generated from the power source potential VDD2 that is supplied by the power supply portion 904.

Although the writing operation of a nonvolatile memory is usually an operation with high power consumption, since the potential VHH can be generated from the potential VDD2 by this structure, the writing operation can be performed with more stability.

In addition to having the high potential power source (VHH) and the normal power source (VDD), it is effective to have a structure in which a power supply system is separated into two and one is used to supply a more stable potential from the power supply portion 904. For example, by separating a circuit included in the IC chip 902 into an analog region that is weak against fluctuation of power and a logic region that is relatively strong against fluctuation of power, and supplying power to the analog region from the power supply portion 904, operation of the IC chip 902 can be stable.

The antenna 701 has a structure in accordance with a communication standard for wireless tags. For example, in the case where a communication signal is 13.56 MHz, the antenna 701 is to be an antenna for a 13.56 MHz band (typically, a coil antenna).

At this time, the antenna 901 may also be an antenna for a 13.56 MHz band, and a frequency of an electromagnetic wave from a reader/writer for charging the battery 907 may be the same as well. In that case, by a signal for charging and a signal for communication being in the same frequency band, the antenna 901 and the antenna 701 can be unified. By commoditizing the antenna 701 and the antenna 901, a semiconductor device can be reduced in size.

Further, the antenna 901 may have a structure of receiving an electromagnetic wave that occurs randomly in the exterior. In that case, the antenna 901 takes in a faint electromagnetic wave that occurs randomly in the exterior, and performs charging of the battery 907 at little bit at a time.

A nonvolatile memory included in a semiconductor device of the present invention can be reduced in current consumption during writing, and be low power consuming. Accordingly, by including such a nonvolatile memory, an active-type wireless tag with a long lifetime of a battery, or a passive-type wireless tag with a wide communication range in which writing to the memory is possible.

Further, since a semiconductor device of the present invention includes a battery that is wirelessly chargeable, it is possible to widen a communication range of a writing operation by using this battery for a high power source voltage of a memory. In addition, by using a nonvolatile memory of the present invention, power consumption during reading is reduced and a load of the battery is also reduced. As a result, performance improvement by size reduction of the battery and stabilization of the power source are possible.

Note that, "IC chip" is a generic name for a chip provided with an integrated circuit, and silicon, glass, plastic, paper, or the like can be used for a base of the integrated circuit. Further, the IC chip 902 shown in FIG. 9 may be composed of a plurality of IC chips.

Note that although in FIG. 9, a structure is shown in which the antennae 701 and 901 are provided outside of the IC chip 902, the structure may be that in which the antennae 701 and 901 are incorporated into the IC chip 902. In addition, a communication method may be either an electric wave method or an electromagnetic induction method.

This embodiment can be appropriately combined with embodiment modes and other embodiments described in this specification.

Embodiment 4

In this embodiment, an example of a manufacturing method of a semiconductor device of the present invention described in the above embodiment is described with reference to a partial cross-sectional diagram.

First, as shown in FIG. 10A, a peeling layer 1003 is formed over one surface of a substrate 1001 with an insulating film 1002 interposed therebetween, and then an insulating film 1004 functioning as a base film and a semiconductor film (e.g., a film containing amorphous silicon) 1005 are stacked thereover. It is to be noted that the insulating film 1002, the peeling layer 1003, the insulating film 1004, and the semiconductor film 1005 can be formed consecutively.

The substrate 1001 is selected from a glass substrate, a quartz substrate, a metal substrate (e.g., a stainless steel substrate), a ceramic substrate, a semiconductor substrate such as a Si substrate, or the like. Alternatively, a plastic substrate made of polyethylene terephthalate (PET), polyethylene naphthalate (PEN), polyether sulfone (PES), acrylic, or the like can be used. In this process, although the peeling layer 1003 is provided over the entire surface of the substrate 1001 with the insulating film 1002 interposed therebetween, the peeling layer 1003 can also be selectively formed by photolithography after being provided over the entire surface of the substrate 1001.

The insulating films 1002 and 1004 are each formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when each of the insulating films 1002 and 1004 is formed to have a two-layer structure, a silicon nitride oxide film may be formed as a first insulating film and a silicon oxynitride film may be formed as a second insulating film. In addition, a silicon nitride film may be formed as a first insulating film and a silicon oxide film may be formed as a second insulating film. The insulating film 1002 functions as a blocking layer which prevents an impurity element contained in the substrate 1001 from getting mixed into the peeling layer 1003 or elements formed thereover. The insulating film 1004 functions as a blocking layer which prevents an impurity element contained in the substrate 1001 or the peeling layer 1003 from getting mixed into elements formed over the insulating film 1004. In this manner, providing the insulating films 1002 and 1004 which function as the blocking layers can prevent adverse effects on the elements formed over the peeling layer 1003 or the insulating film 1004, which would otherwise be caused by an alkali metal such as Na or an alkaline earth metal contained in the substrate 1001 or by the impurity element contained in the peeling layer 1003. It is to be noted that when quartz is used for the substrate 1001, for example, the insulating films 1002 and 1004 may be omitted.

The peeling layer 1003 may be formed using a metal film, a stacked structure of a metal film and a metal oxide film, or the like. As a metal film, either a single layer or stacked layers is/are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as its main component. In addition, such materials can be formed by a sputtering method, various CVD methods such as a plasma CVD method, or the like. A stacked structure of a metal film and a metal oxide film can be obtained by the steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the surface of the metal film. For example, when a tungsten film is provided as a metal film by a sputtering method, a CVD method, or the like, a metal oxide film of tungsten oxide can be formed on the surface of the tungsten film by application of plasma treatment to the tungsten film. In that case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When tungsten oxide is formed, there is no particular limitation on the value of x, and thus, which of the above oxides is to be formed may be determined base on the etching rate or the like. In addition, after a metal film (e.g., tungsten) is formed, an insulating film formed of silicon oxide ($SiO_2$) or the like may be formed over the metal film by a sputtering method, and also metal oxide (e.g., tungsten oxide on tungsten) may be formed on the metal film. Moreover, a high-density-plasma treatment may be applied as the plasma treatment, for example. Besides, metal nitride or metal oxynitride may also be formed. In that case, plasma treatment or heat treatment may be applied to the metal film under a nitrogen atmosphere or an atmosphere containing nitrogen and oxygen.

The semiconductor film 1005 is formed with a thickness of 25 to 200 nm (preferably, 30 to 150 nm) by a sputtering method, an LPCVD method, a plasma CVD method, or the like.

Next, as shown in FIG. 10B, the semiconductor film 1005 is crystallized by laser irradiation. Alternatively, the crystallization of the semiconductor film 1005 may be performed by a method combining the laser crystallization with a thermal crystallization method using RTA or an annealing furnace or with a thermal crystallization method using a metal element that promotes the crystallization. After that, an obtained semiconductor film is etched into a desired shape, whereby semiconductor films 1005a to 1005f that are crystallized are formed. Then, a gate insulating film 1006 is formed so as to cover the semiconductor films 1005a to 1005f.

The gate insulating film 1006 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 1006 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film.

An example of a formation process of the semiconductor films 1005*a* to 1005*f* is briefly explained below. First, an amorphous semiconductor film with a thickness of 50 to 60 nm is formed by a plasma CVD method. Then, a solution containing nickel which is a metal element that promotes crystallization is retained on the amorphous semiconductor film, which is followed by dehydrogenation treatment (500° C. for one hour) and thermal crystallization treatment (550° C. for four hours). Thus, a crystalline semiconductor film is formed. Then, the crystalline semiconductor film is subjected to laser irradiation and then a photolithography process to form the semiconductor films 1005*a* to 1005*f* that are crystallized. It is to be noted that crystallization of the amorphous semiconductor film may be performed only by laser irradiation, not by thermal crystallization which uses a metal element that promotes crystallization.

Note that as a laser oscillator used for crystallization, either a continuous wave laser (a CW laser) or a pulsed laser can be used. As a laser that can be used here, there are gas lasers such as an Ar laser, a Kr laser, and an excimer laser; a laser of which a medium is single-crystal YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of approximately 0.01 to 100 $MW/cm^2$ (preferably, 0.1 to 10 $MW/cm^2$) is needed, and irradiation is performed with a scanning rate of approximately 10 to 2000 cm/sec. It is to be noted that the laser of which a medium is single crystal YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser, or a Ti:sapphire laser can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film has been melted by the laser beam and is solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1006 may be formed by oxidization or nitridation of the surfaces of the semiconductor films 1005*a* to 1005*f* by a high-density plasma treatment. For example, plasma treatment with a mixed gas of a rare gas such as He, Ar, Kr, or Xe, and oxygen, nitrogen oxide ($NO_2$), ammonia, nitrogen, or hydrogen is conducted. When plasma is excited by the introduction of microwaves, plasma with a low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film with a thickness of 1 to 20 nm, typically 5 to 10 nm, is formed on the semiconductor films. Since the reaction in this case is a solid-phase reaction, the interface state density between the insulating film and the semiconductor films can be quite low. Since such high-density plasma treatment directly oxidizes (or nitrides) the semiconductor films (crystalline silicon or polycrystalline silicon), desirably, the insulating film can be formed with extremely little unevenness. In addition, since crystal grain boundaries of crystalline silicon are not strongly oxidized, an excellent state is obtained. That is, by the solid-phase oxidation of the surfaces of the semiconductor films by high-density plasma treatment which is described in this embodiment, an insulating film with a uniform thickness and low interface state density can be formed without excessive oxidation reaction at the crystal grain boundaries.

Note that as the gate insulating film 1006, it may be that just an insulating film formed by high-density plasma treatment is used, or a stacked layer may be employed, which is obtained by deposition of an insulating film such as silicon oxide, silicon oxynitride, or silicon nitride over the insulating film, by a CVD method using plasma or thermal reaction. It is needless to say that insulating layers of silicon oxide, silicon oxynitride, silicon nitride, or and the like may be deposited by a CVD method, and then the films may be subjected to high-density plasma treatment. In either case, a transistor which includes such an insulating film formed by high-density plasma treatment in a part or the whole of its gate insulating film can have reduced characteristic variations.

In addition, the semiconductor films 1005*a* to 1005*f*, which are obtained by irradiation of a semiconductor film with a continuous wave laser beam or a laser beam oscillated with a repetition rate of 10 MHz or more and scanning the semiconductor film with the laser beam in one direction to crystallize the semiconductor film, have a characteristic in that their crystals grow in the beam scanning direction. Transistors are each arranged so that its channel length direction (direction in which carriers move when a channel formation region is formed) is aligned with the scanning direction, and the above-described gate insulating film is combined with the semiconductor film, whereby thin film transistors (TFTs) with high electron field effect mobility and reduced variations in characteristics can be obtained.

Next, a first conductive film and a second conductive film are stacked over the gate insulating film 1006. Here, the first conductive film is formed to a thickness of 20 to 100 nm by a CVD method, a sputtering method, or the like. The second conductive film is formed to a thickness of 100 to 400 nm. The first conductive film and the second conductive film are each formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component. Alternatively, the first conductive film and the second conductive film may each be formed of semiconductor materials typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film, thermal treatment for the purpose of heat activation can be applied thereto. In addition, in the case where a two-layer structure is not employed, but a three-layer structure is employed, it is preferable to use a stacked structure of a molybdenum film, an aluminum film, and a molybdenum film.

Next, a resist mask is formed by photolithography, and etching treatment is conducted to form gate electrodes and gate lines. Thus, gate electrodes 1007 are formed above the semiconductor films 1005a to 1005f. Here, a stacked structure of a first conductive film 1007a and a second conductive film 1007b is shown as an example of the gate electrode 1007. However, the number of stacked layers is not particularly limited.

Next, as shown in FIG. 10C, the semiconductor films 1005a to 1005f are doped with an n-type impurity element at low concentration, using the gate electrodes 1007 as masks by an ion doping method or an ion implantation method. Then, a resist mask is selectively formed by photolithography, and the semiconductor films 1005c and 1005e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1005a to 1005f so as to be contained at concentrations of $1 \times 10^{15}$ to $1 \times 10^{19}$/cm$^3$. Thus, n-type impurity regions 1008 are formed. In addition, boron (B) is used as a p-type impurity element, and is selectively introduced into the semiconductor films 1005c and 1005e so as to be contained at concentrations of $1 \times 10^{19}$ to $1 \times 10^{20}$/cm$^3$. Thus, p-type impurity regions 1009 are formed.

Subsequently, an insulating film is formed so as to cover the gate insulating film 1006 and the gate electrodes 1007. The insulating film is formed to have either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching mainly in the perpendicular direction, so that insulating films 1010 (also referred to as sidewalls) which are in contact with the side surfaces of the gate electrodes 1007 are formed. The insulating films 1010 are used as masks in doping for forming LDD (Lightly Doped Drain) regions.

Next, the semiconductor films 1005a, 1005b, 1005d, and 1005f are doped with an n-type impurity element at high concentration, using resist masks formed by photolithography, the gate electrodes 1007 and the insulating films 1010 as masks. Thus, n-type impurity regions 1011 are formed. Here, phosphorus (P) is used as an n-type impurity element, and is selectively introduced into the semiconductor films 1005a, 1005b, 1005d, and 1005f so as to be contained at concentrations of $1 \times 10^{19}$ to $1 \times 10^{20}$/cm$^3$. Thus, the n-type impurity regions 1011 with higher concentration of impurity than that of the impurity regions 1008 are formed.

Through the above steps, n-channel thin film transistors 1000a, 1000b, 1000d, and 1000f, and p-channel thin film transistors 1000c and 1000e are formed, as shown in FIG. 10D. Note that here, the thin film transistors 1000a and 1000b are thin film transistors that are used in a memory cell array portion of a nonvolatile memory of the present invention, and the thin film transistors 1000c to 1000e show other thin film transistors that are included in a semiconductor device. Note that the thin film transistors 1000a and 1000b used in the memory cell array portion and a portion of the transistors used during writing are applied with a higher potential than other transistors. Accordingly, they are transistors with high withstand voltage. Therefore, at least a channel length L of each of the thin film transistors 1000a and 1000b is longer than channel lengths of other transistors. It is needless to say that the thin film transistors 1000c to 1000e can be used as thin film transistors that form the nonvolatile memory of the present invention.

Note that in the n-channel thin film transistor 1000a, a channel formation region is formed in a region of the semiconductor film 1005a which overlaps with the gate electrode 1007; the impurity regions 1011 serving as source and drain regions are formed in regions of the semiconductor film 1005a which do not overlap with the gate electrode 1007 and the insulating film 1010; and low concentration impurity regions (LDD regions) are formed in regions of the semiconductor film 1005a which overlap with the insulating film 1010, between the channel formation region and the impurity regions 1011. Similarly, channel formation regions, low concentration impurity regions, and the impurity regions 1011 are formed in the n-channel thin film transistors 1000b, 1000d, and 1000f.

In the p-channel thin film transistor 1000c, a channel formation region is formed in a region of the semiconductor film 1005c which overlaps with the gate electrode 1007, and the impurity regions 1009 serving as source and drain regions are formed in regions of the semiconductor film 1005c which do not overlap with the gate electrode 1007. Similarly, a channel formation region and the impurity regions 1009 are formed in the p-channel thin film transistor 1000e. Here, although LDD regions are not formed in the p-channel thin film transistors 1000c and 1000e, LDD regions may be provided in the p-channel thin film transistors or a structure without LDD regions may be applied to the n-channel thin film transistors.

Figure 11A:
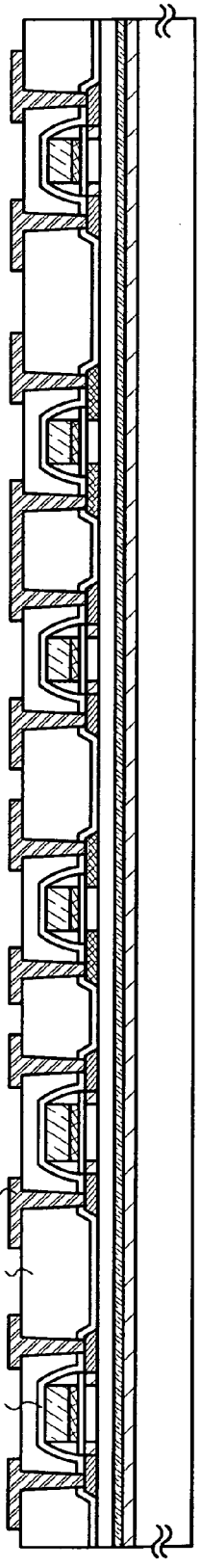
FIGS. 11A to 11C are partial cross-sectional diagrams of a semiconductor device of the present invention.

Next, as shown in FIG. 11A, an insulating film with a single layer structure or a stacked structure is formed so as to cover the semiconductor films 1005a to 1005f, the gate electrodes 1007, and the like. Then, conductive films 1013 electrically connected to the impurity regions 1009 and 1011 which form the source and drain regions of the thin film transistors 1000a to 1000f are formed over the insulating film. The insulating film is formed with a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. In this embodiment, the insulating film is formed to have a two-layer structure, and a silicon nitride oxide film is formed as a first insulating film 1012a and a silicon oxynitride film is formed as a second insulating film 1012b. In addition, the conductive films 1013 can form the source and drain electrodes of the thin film transistors 1000a to 1000f.

Before the insulating films 1012a and 1012b are formed or after one or both of the insulating films 1012a and 1012b is/are formed, heat treatment is preferably conducted for recovery of the crystallinity of the semiconductor films, activation of the impurity element which has been added into the semiconductor films, or hydrogenation of the semiconductor films. As the heat treatment, thermal annealing, laser annealing, RTA, or the like may be applied.

Further, the conductive films 1013 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component by a CVD method, a sputtering method or the like. An alloy material containing aluminum as its main component corresponds to, for example, a material which contains aluminum as its main component and also contains nickel, or a material which contains aluminum as its main component, and also contains nickel and one or both of carbon and silicon. The conductive films 1013 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that the "barrier film" corresponds to a thin film formed of titanium, titanium nitride, molybdenum, or molybdenum nitride. Aluminum and aluminum silicon are suitable materials for forming the conductive films 1013 because they have low resistance and are inexpensive. When barrier layers are provided as the top layer and the bottom layer, generation of hillocks of aluminum or aluminum silicon can be prevented. In addition, when a barrier film formed of titanium which is an element having a high reducing property is formed, even when there is a thin natural oxide film formed on a semiconductor film, the natural oxide film can be chemically reduced, and a favorable contact between the conductive film 1013 and the semiconductor film can be obtained.

Figure 11B:
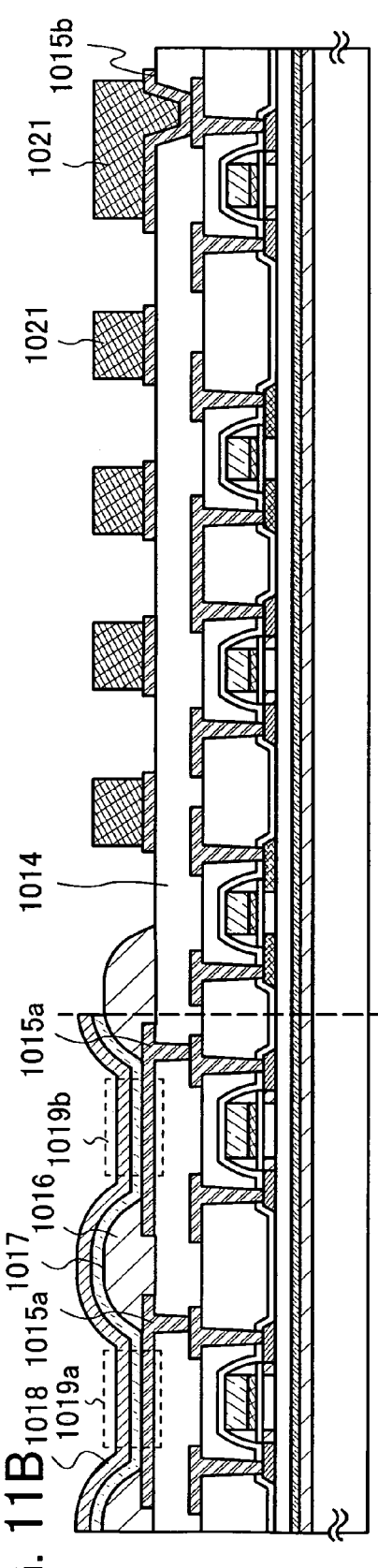

Next, an insulating film 1014 is formed so as to cover the conductive films 1013, and conductive films 1015*a* and 1015*b* are formed over the insulating film 1014 so as to be electrically connected to the conductive films 1013 each forming a source electrode or drain electrode of a thin film transistor. In FIG. 11B, the conductive films 1015*a* are shown as conductive films that are electrically connected to the conductive films 1013 each forming a source electrode or drain electrode of each of the thin film transistor 1000*a* and the thin film transistor 1000*b*, which form a memory cell array portion. Further, in FIG. 11B, the semiconductor film 1015*b* is shown as a conductive film that is electrically connected to the conductive film 1013 forming a source electrode or drain electrode of the thin film transistor 1000*f*. Note that conductive films 1015*a* function as first electrodes of memory elements that are formed later. Further, the conductive film 1015*b* functions as a base film of an antenna that is formed later. With the conductive film 1015*b*, connection between the thin film transistor 1000*f* and the antenna can be more secure, and adhesion between the insulating film 1014 and the antenna can be improved as well. The conductive films 1015*a* and the conductive film 1015*b* can be formed using any of the materials described for the conductive film 1013 above.

Note that the insulating film 1014 can be formed with a single layer or a stacked layer of an insulating film containing oxygen and/or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin, by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. In addition, a fluoro group may be used as the substituent. Further, a fluoro group and an organic group containing at least hydrogen may be used as the substituent.

Next, in order to separate memory elements forming the memory cell array portion from each other, a partition (insulating layer) 1016 is formed between first electrodes of neighboring memory elements. Note that in a cross-section of the partition (insulating layer) 1016, it is preferable that a side surface of each partition (insulating layer) 1016 has an angle of gradient that is more than or equal to 10 degrees and less than 60 degrees, and preferably more than or equal to 25 degrees and less than or equal to 45 degrees, with respect to a surface of the first electrode. Further, a surface of each partition 1016 preferably has a curve.

Note that for the partitions (insulating layers) 1016, an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular compound such as polyimide, aromatic polyamide, or polybenzimidazole; or a siloxane material can be used. In addition, a resin material such as a vinyl resin such as polyvinyl alcohol or polyvinyl butyral; an epoxy resin; a phenol resin; a novolac resin; an acrylic resin; a melamine resin; or a urethane resin can be used. Further, an organic material such as benzocyclobutene, parylene, or polyimide; a compound material made by polymerization; or a composition material containing a water-soluble homopolymer and a water-soluble copolymer; or the like may be used. As a manufacturing method, a CVD method, a sputtering method, a droplet discharging method, a dispenser method, a printing method, or the like can be used. In addition, a thin film obtained by a spin-coating method or the like can be used.

Next, a conductive film 1021 functioning as an antenna that is electrically connected to the conductive film 1015*b* is formed.

The conductive film 1021 is formed by a CVD method, a sputtering method, a printing method such as screen printing or gravure printing, a droplet discharging method, a dispenser method, a plating method, or the like, using a conductive material. The conductive material is formed of an element selected from aluminum (Al), titanium (Ti), silver (Ag), copper (Cu), gold (Au), platinum (Pt), nickel (Ni), palladium (Pd), tantalum (Ta), or molybdenum (Mo); or an alloy material or compound material containing the element as its main component. The conductive film 1021 is formed to have a single layer structure or a stacked structure.

For example, in the case of forming the conductive film 1021 functioning as an antenna by using a screen printing method, a conductive paste, in which conductive particles with a grain diameter of several nanometers to several tens of nanometers are dissolved or dispersed in an organic resin, is selectively printed. For the conductive particles, metal particles including at least one type of metal such as silver (Ag), gold (Au), copper (Cu), nickel (Ni), platinum (Pt), palladium (Pd), tantalum (Ta), molybdenum (Mo), and titanium (Ti); fine particles of silver halide; or dispersant nanoparticles can be used. In addition, for the organic resin contained in the conductive paste, one or more selected from an organic resin functioning as a binder, a solvent, a dispersant, and a covering material for metal particles can be used. Typically, an organic resin such as an epoxy resin or a silicone resin can be given. In addition, in forming the conductive films, baking is preferably performed after the conductive paste is pushed out. For example, in the case of using fine particles (for example, a grain diameter of more than or equal to 1 nm to less than or equal to 100 nm) containing silver as its main component as a material for the conductive paste, the conductive films are obtained by curing the conductive paste by baking at a temperature in a range of 150 to 300° C. inclusive. In addition, fine particles containing solder or lead-free solder as its main component may be used, and in this case, fine particles of a grain diameter of less than or equal to 20 μm is preferably used. Solder and lead-free solder have an advantage that they are low in cost.

Next, memory elements forming the memory cell array portion are formed. A memory layer 1017 is formed over the partitions (insulating layers) 1016 and the first electrodes of the memory elements, that is, the conductive films 1015a. Here, an example in which an organic compound layer is used as the memory layer 1017 is described. This organic compound layer has a property of partially connecting each first electrode and a second electrode, in other words, causing a short circuit by applying a voltage. Accordingly, by applying a predetermined voltage to each memory element, the memory element can transition from a high resistance state to a low resistance state, and a writing operation can be performed. Note that although in this embodiment the case of using an organic compound layer as the memory layer 1017 is described, it is acceptable as long as the memory layer 1017 is a layer formed of a substance that can transition to a low resistance state by applying a voltage.

The memory layer 1017 may be formed using an organic compound that has a hole-transporting property or an electron-transporting property. It is to be noted that, here, a compound that has a hole-transporting property is not one that transports holes only; a compound that has a hole-transporting property refers to a compound which also has an electron-transporting property, however, the hole mobility is higher than the electron mobility. Similarly, a compound that has an electron-transporting property is not one that transports electrons only; a compound that has an electron-transporting property refers to a compound which also has a hole-transporting property, however, the electron mobility is higher than the hole mobility. Accordingly, a material that transports both holes and electrons is also included in these categories.

For example, for an organic material that has a hole-transporting property, an aromatic amine compound (that is, a material with a benzene ring-nitrogen bond) such as 2,7-di (N-carbazolyl)-spiro-9,9'-bifluorene (abbreviated designation: SFDCz), 4,4'-bis[N-(1-napthyl)-N-phenylamino]biphenyl (abbreviated designation: NPB), 4,4'-bis[N-(3-methylphenyl)-N-phenylamino]biphenyl (abbreviated designation: TPD), 4,4',4"-tris(N,N-diphenylamino)triphenylamine (abbreviated designation: TDATA), 4,4',4"-tris[N-(3-methylphenyl)-N-phenylamino]triphenylamine (abbreviated designation: MTDATA), 4,4'-bis(N-(4-(N,N-di-m-tolylamino)phenyl)-N-phenylamino)biphenyl (abbreviated designation: DNTPD), or the like; a phthalocyanine compound such as phthalocyanine (abbreviated designation: $H_2Pc$), copper phthalocyanine (abbreviated designation: CuPc), vanadyl phthalocyanine (abbreviated designation: VOPc), or the like; and the like can be given. For an organic compound with a high electron-transporting property, a material formed of a metal complex or the like that has a quinoline skeleton or benzoquinoline skeleton, such as tris(8-quinolinolato)aluminum (abbreviated designation: Alq), tris(4-methyl-8-quinolinolato)aluminum (abbreviated designation: $Almq_3$), bis(10-hydroxybenzo[h]quinolinato)beryllium (abbreviated designation: $BeBq_2$), bis(2-methyl-8-quinolinolato)-4-phenylphenolato-aluminum (abbreviated designation: BAlq), and the like can be given. Furthermore, in addition to these, a material of a metal complex or the like that has an oxazole-based or thiazole-based ligand, such as bis[2-(2-hydroxyphenyl)benzoxazolato]zinc (abbreviated designation: $Zn(BOX)_2$), bis[2-(2-hydroxyphenyl)benzothiazolato] zinc (abbreviated designation: $Zn(BTZ)_2$), or the like can be used. Moreover, in addition to metal complexes, 2-(4-biphenylyl)-5-(4-tert-butylphenyl)-1,3,4-oxadiazole (abbreviated designation: PBD), 1,3-bis[5-β-tert-butylphenyl)-1,3,4-oxadiazol-2-yl]benzene (abbreviated designation: OXD-7), 3-(4-tert-butylphenyl)-4-phenyl-5-(4-biphenyl)-1,2,4-triazole (abbreviated designation: TAZ), 3-(4-tert-butylphenyl)-4-(4-ethylphenyl)-5-(4-biphenylyl)-1,2,4-triazole (abbreviated designation: p-EtTAZ), bathophenanthroline (abbreviated designation: BPhen), bathocuproine (abbreviated designation: BCP), and the like can be given.

In addition to the above, for example, the organic compound layer 113 may be formed using 2,3-bis(4-diphenylaminophenyl)quinoxaline (abbreviated designation: TPAQn), 1,3,5-tri(N-carbazolyl)benzene (abbreviated designation: TCZB), 9-[4-(N-carbazolyl)phenyl]-10-phenylanthracene (abbreviated designation: CzPA), 3,6-diphenyl-9-[4-(10-phenyl-9-anthryl)phenyl]-9H-carbazole (abbreviated designation: DPCzPA), 2-t-butyl-9,10-bis(4-(N-carbazolyl)phenyl)anthracene (abbreviated designation: CzBPA), 3-[N-(9-phenylcarbazol-3-yl)-N-phenylamino]-9-phenylcarbazole (abbreviated designation: PCzPCA1), 3,6-bis[N-(9-phenyl-carbazol-3-yl)-N-phenylamino]-9-phenylcarbazole (abbreviated designation: PCzPCA2), 3-[N-(1-naphthyl)-N-(9-phenylcarbazol-3-yl)amino]-9-phenylcarbazole (abbreviated designation: PCzPCN1), 4,4'-di(N-carbazolyl) biphenyl (abbreviated designation: CBP), 1,3,5-tris[4-(N-carbazolyl)phenyl]benzene (abbreviated designation: TCPB), N-(2-naphthyl)carbazole (abbreviated designation: NCz), or the like.

In addition, the organic compound layer can be formed using an evaporation method, an electron-beam deposition method, a sputtering method, a CVD method, or the like. In addition, for alternative methods, a spin coating method, a sol-gel method, a printing method, a droplet discharge method, or the like may be used, or a combination of any of the above methods with any of these methods may be used.

In addition, for the organic compound layer, an insulator may be mixed into the organic compound that has a hole-transporting property or electron-transporting property. Also, a semiconductor layer may be provided between the first electrodes and the memory layer.

Next, a conductive film 1018 functioning as a second electrode is formed over the memory layer 1017. This conductive film 1018 can be formed using any material for the conductive film 1013 described above.

Accordingly, memory elements 1019a and 1019b including the conductive films 1015a functioning as first electrodes, the memory layer 1017, and the conductive film 1018 functioning as the second electrode can be formed. Note that these memory elements are separated by the partitions (insulating layers) 1016. Accordingly, not only an effect of an electric field to a neighboring memory element can be prevented, a break in the memory layer 1017 that occurs due to a step of the conductive film 1015a when providing the memory layer 1017 can be prevented using the partitions (insulating layers) 1016. Note that in the case of a structure in which the memory elements 1019a and 1019b can be separated from each other without the partitions (insulating layers) 1016, the partitions (insulating layers) 1016 does not need to be provided in particular.

Figure 11C:
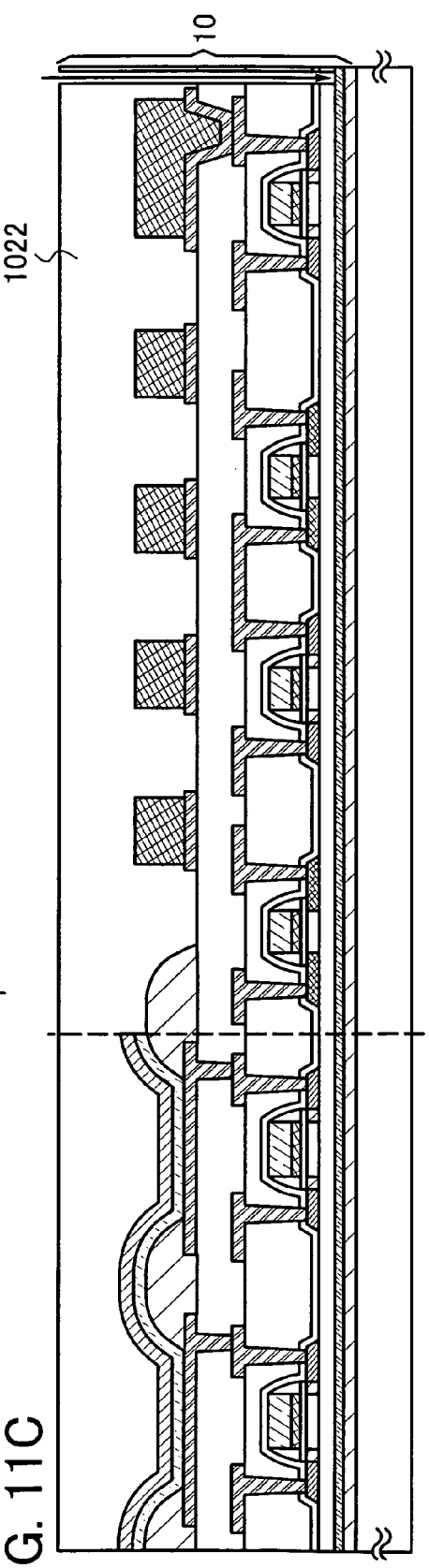

Next, as shown in FIG. 11C, after forming an insulating film 1022 so as to cover the conductive film 1021 and memory elements 1019a, 1019b, a layer including the thin film transistors 1000a to 1000f, the conductive film 1021, the memory elements 1019a and 1019b, and the like (hereinafter referred to as an "element formation layer 10") is peeled off the substrate 1001. Here, after forming opening portions in the element formation layer 10 excluding the region of the thin film transistors 1000a to 1000f by laser irradiation (e.g., UV light), the element formation layer 10 can be peeled off the substrate 1001 with a physical force. The peeling layer 1003 may be selectively removed by introduction of an etchant into the opening portions before peeling the element formation layer 10 off the substrate 1001. As the etchant, a gas or a liquid containing halogen fluoride or an interhalogen compound is used. For example, when chlorine trifluoride ($ClF_3$) is used as the gas containing halogen fluoride, the element formation layer 10 is peeled off the substrate 1001. The whole peeling layer 1003 is not removed but part thereof may be left. Accordingly, the consumption of the etchant can be suppressed and process time for removing the peeling layer can be shortened. In addition, even after removing the peeling layer 1003, the element formation layer 10 can be held above the substrate 1001. In addition, by reuse of the substrate 1001 from which the element formation layer 10 has been peeled, cost reduction can be achieved.

The insulating film 1022 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like.

In this embodiment, as shown in FIG. 12A, after forming the opening portions in the element formation layer 10 by laser irradiation, a first sheet material 1023 is attached to one surface of the element formation layer 10 (a surface where the insulating film 1022 is exposed), and then the element formation layer 10 is peeled off the substrate 1001.

Next, as shown in FIG. 12B, a second sheet material 1024 is attached to the other surface of the element formation layer 10 (the surface exposed by peeling). Note that as the first sheet material 1023 and the second sheet material 1024, a hot-melt film or the like can be used.

As the first sheet material 1023 and the second sheet material 1024, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided on one of its surfaces, or a film with an antistatic material provided on each of its surfaces. The film with an antistatic material provided on one of its surfaces may be attached to the layer so that the antistatic material is placed on the inner side of the film or the outer side of the film. The antistatic material may be provided for the entire surface of the film, or over a part of the film. As an antistatic material, a metal, indium tin oxide (ITO), or a surfactant such as an amphoteric surfactant, a cationic surfactant, or a nonionic surfactant can be used. Further, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be protected from adverse effects such as external static electricity when dealt with as a commercial product.

By the foregoing steps, a semiconductor device including a nonvolatile memory of the present invention can be manufactured. Note that although in this embodiment, an example in which the antenna is formed over the same substrate as the thin film transistors is described, the present invention is not limited to this structure. The thin film transistors and the antenna may be electrically connected by attaching, using a resin containing conductive particles, a first substrate over which a layer including the thin film transistors are formed and a second substrate over which a conductive layer functioning as the antenna is formed.

In addition, although a step of forming elements such as thin film transistors over a substrate and then peeling them off afterwards is shown, peeling does not have to be performed and the substrate with elements formed thereover may be a product as is. Further, after providing elements such as thin film transistors over a glass substrate, the glass substrate may be polished from a side opposite a side over which the elements are provided, in order to reduce thickness and size of a semiconductor device.

This embodiment can be appropriately combined with embodiment modes and other embodiments described in this specification.

Embodiment 5

In this embodiment, a manufacturing method of a transistor included in a semiconductor device or a nonvolatile memory of the present invention, that is different from the above embodiments, is described. The transistor included in the semiconductor device or the nonvolatile memory of the present invention may be a MOS transistor over a single-crystal substrate, other than a thin film transistor over an insulating substrate as described in the above embodiment.

In this embodiment, an example of a manufacturing method of a transistor included in a semiconductor device or a nonvolatile memory of the present invention is described with reference to partial cross-sectional diagrams shown in FIGS. 13A to 15.

Figure 13A:
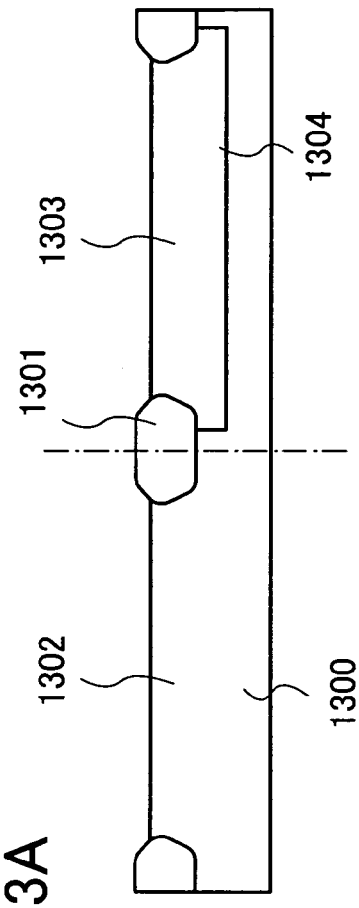
FIGS. 13A to 13C are partial cross-sectional diagrams of a transistor included in a semiconductor device of the present invention.

First, separated regions 1302 and 1303 (hereinafter simply referred to as regions 1302 and 1303) are formed in a semiconductor substrate 1300 (see FIG. 13A). The regions 1302 and 1303 provided in the semiconductor substrate 1300 are separated from each other by an insulating film (also referred to as a field oxide film) 1301. The example shown here is the case where a single crystal Si substrate having n-type conductivity is used as the semiconductor substrate 1300, and a p well 2307 is formed in the region 1303 of the semiconductor substrate 1300.

Any substrate can be used as the substrate 1300 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by Implanted Oxygen) method, or the like can be used.

The regions 1302 and 1303 can be formed by a LOCOS (Local Oxidation of Silicon) method, a trench isolation method, or the like.

In addition, a p well formed in the region 1303 of the semiconductor substrate 1300 can be formed by selective doping of the semiconductor substrate 1300 with a p-type impurity element. As a p-type impurity element, boron (B), aluminum (Al), gallium (Ga), or the like can be used.

In this embodiment, although the region 1302 is not doped with an impurity element because an n-type semiconductor substrate is used as the semiconductor substrate 1300, an n well may be formed in the region 1302 by introduction of an n-type impurity element. As an n-type impurity element, phosphorus (P), arsenic (As), or the like can be used. When a p-type semiconductor substrate is used, on the other hand, the region 1302 may be doped with an n-type impurity element to form an n well, whereas the region 1303 may not be doped with an impurity element.

Figure 13B:
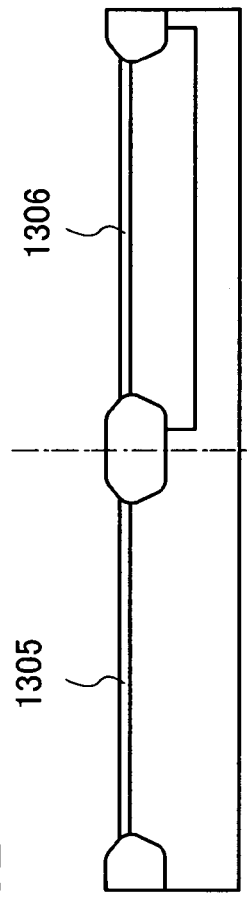

Next, as shown in FIG. 13B, insulating films 1305 and 1306 are formed so as to cover the regions 1302 and 1303, respectively.

For example, surfaces of the regions 1302 and 1303 provided in the semiconductor substrate 1300 are oxidized by heat treatment, so that the insulating films 1305 and 1306 can be formed of silicon oxide films. Alternatively, the insulating films 1305 and 1306 may be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 1305 and 1306 can be formed by plasma treatment as described above. For example, the insulating films 1305 and 1306 can be formed using a silicon oxide ($SiO_x$) film or a silicon nitride ($SiN_x$) film which is obtained by application of high-density plasma oxidation or high-density plasma nitridation treatment to the surfaces of the regions 1302 and 1303 provided in the semiconductor substrate 1300. Furthermore, after applying high-density plasma oxidation treatment to the surfaces of the regions 1302 and 1303, high-density plasma nitridation treatment may be performed. In that case, silicon oxide films are formed on the surfaces of the regions 1302 and 1303, and then silicon oxynitride films are formed on the silicon oxide films. Thus, the insulating films 1305 and 1306 are each formed to have a stacked structure of the silicon oxide film and the silicon oxynitride film. In addition, high-density plasma oxidation or high-density nitridation treatment may be applied to the silicon oxide films after silicon oxide films are formed on the surfaces of the regions 1302 and 1303 by a thermal oxidation method.

The insulating films 1305 and 1306 function as gate insulating films of transistors which are completed later.

Figure 13C:
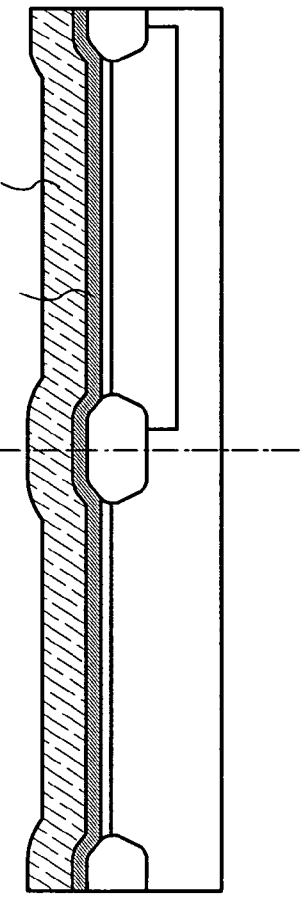

Next, as shown in FIG. 13C, a conductive film is formed so as to cover the insulating films 1305 and 1306 which are formed over the regions 1302 and 1303, respectively. Here, an example is shown in which conductive films 1307 and 1308 are sequentially stacked as the conductive film. Needless to say, the conductive film may be formed to have a single layer or a stacked structure of three or more layers.

As materials of the conductive films 1307 and 1308, an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked structure is employed in which the conductive film 1307 is formed using tantalum nitride and the conductive film 1308 is formed thereover using tungsten. Alternatively, it is also possible to form the conductive film 1307 using a single-layer film or a stacked film of tungsten nitride, molybdenum nitride, and/or titanium nitride and form the conductive film 1308 using a single-layer film or a stacked film of tantalum, molybdenum, and/or titanium.

Next, the stacked conductive films 1307 and 1308 are selectively removed by etching, so that the conductive films 1307 and 1308 remain above part of the regions 1302 and 1303, respectively. Thus, gate electrodes 1309 and 1310 are formed as shown in FIG. 14A.

Next, a resist mask 1311 is selectively formed so as to cover the region 1302, and the region 1303 is doped with an impurity element, using the resist mask 1311 and the gate electrode 1310 as masks, so that impurity regions are formed (see FIG. 14B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

By introduction of an impurity element, impurity regions 1312 which form source and drain regions and a channel formation region 1313 are formed in the region 1303, as shown in FIG. 14B.

Next, as shown in FIG. 14C, a resist mask 1314 is selectively formed so as to cover the region 1303, and the region 1302 is doped with an impurity element, using the resist mask 1314 and the gate electrode 1309 as masks, so that impurity regions are formed. As the impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. At this time, an impurity element (e.g., boron (B)) of a conductivity type different from that of the impurity element introduced into the region 1303 in FIG. 14B is used. As a result, impurity regions 1315 which form source and drain regions and a channel formation region 1316 are formed in the region 1302.

Figure 15:
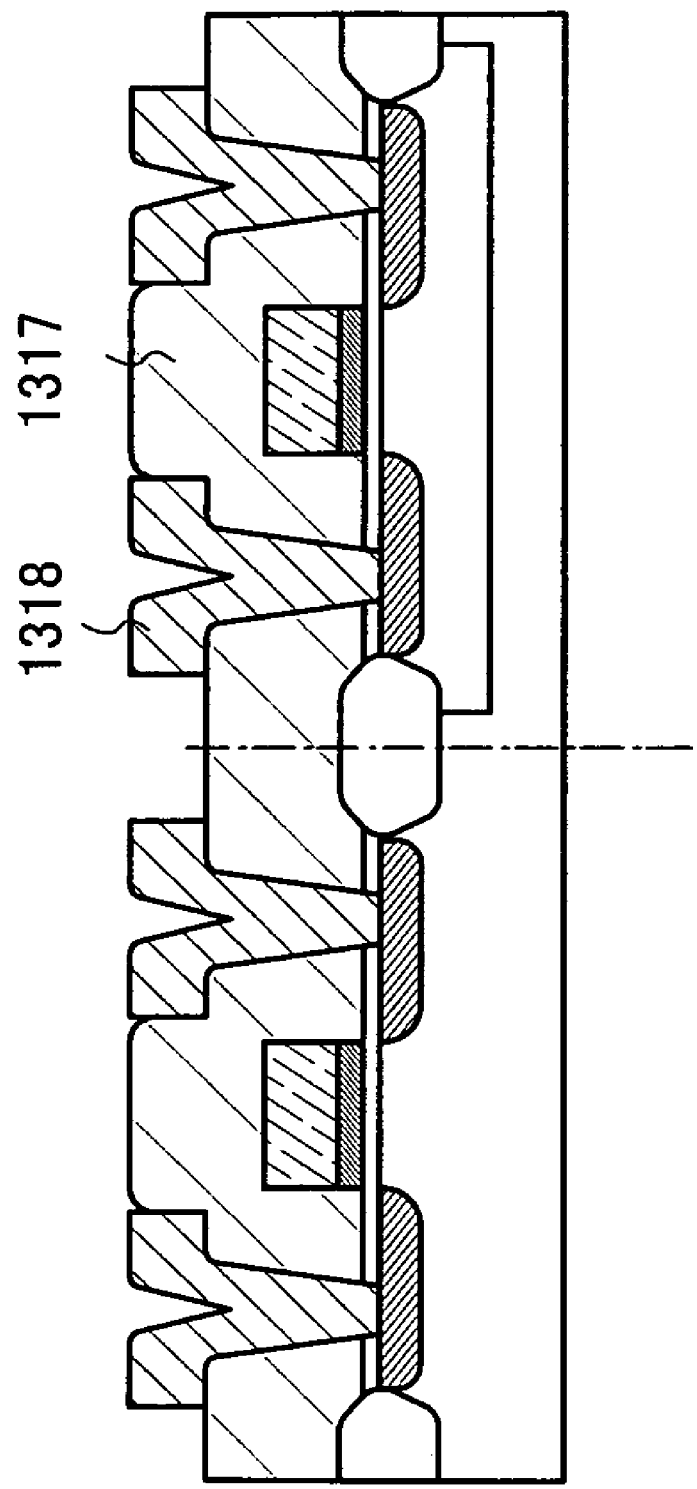
FIG. 15 is a partial cross-sectional diagram of a transistor included in a semiconductor device of the present invention.

Next, as shown in FIG. 15, a second insulating film 1317 is formed so as to cover the insulating films 1305 and 1306 and the gate electrodes 1309 and 1310. Then, wirings 1318, which are electrically connected to the impurity regions 1312 and 1315 formed in the regions 1302 and 1303 respectively, are formed over the second insulating film 1317.

The second insulating film 1317 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or an aryl group) is used. Also, a fluoro group may be used as the substituent, or both a fluoro group and an organic group containing at least hydrogen may be used.

The wirings 1318 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing such an element as its main component by a CVD method, a sputtering method or the like. An alloy material containing aluminum as its main component corresponds to, for example, a material which contains aluminum as its main component and also contains nickel, or a material which contains aluminum as its main component and also contains nickel and one or both of carbon and silicon. The wirings 1318 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are suitable materials for forming the wirings 1318 because they have high resistance and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the wirings 1318 and the crystalline semiconductor film can be obtained.

Accordingly, a MOS transistor can be manufactured using a single-crystal substrate. Note that a structure of the transistor is not limited to that above, and for example, the structure may be an inversely staggered structure, a finFET structure, or the like. Note that with a finFET structure, a short-channel effect that occurs along with reduction in transistor size can be suppressed.

This embodiment can be appropriately combined with embodiment modes and other embodiments described in this specification.

Embodiment 6

In this embodiment, a manufacturing method of a transistor included in a semiconductor device or a nonvolatile memory of the present invention, that is different from the above embodiments, is described. The transistor included in the semiconductor device or the nonvolatile memory of the present invention may be a MOS transistor provided by a different manufacturing method from that of the MOS transistor over a single-crystal substrate described in the above embodiment.

In this embodiment, an example of a manufacturing method of a transistor included in a semiconductor device or a nonvolatile memory of the present invention is described with reference to partial cross-sectional diagrams shown in FIGS. 16A to 19B.

Figure 16A:
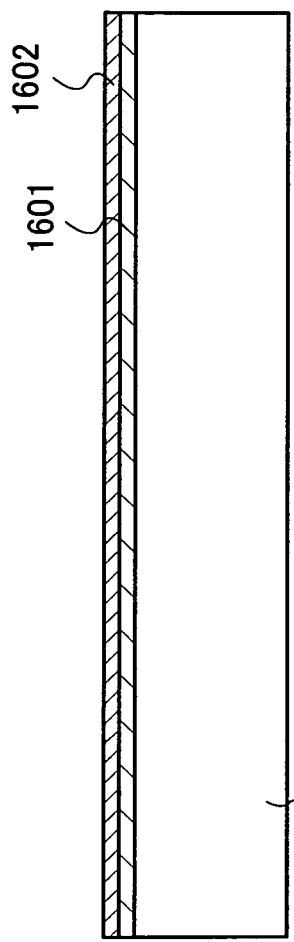
FIGS. 16A to 16C are partial cross-sectional diagrams of a transistor included in a semiconductor device of the present invention.

First, as shown in FIG. 16A, an insulating film is formed over a substrate 1600. Here, a single-crystal Si with n-type conductively is used for the substrate 1600, and an insulating film 1601 and an insulating film 1602 are formed over the substrate 1600. For example, the substrate 1600 is subjected to a heat treatment to form silicon oxide (SiOx) as the insulating film 1601, and then silicon nitride (SiNx) is formed over the insulating film 1601 by a CVD method.

Any substrate can be used as the substrate 1600 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by Implanted Oxygen) method, or the like can be used.

In addition, the insulating film 1602 may be provided by forming the insulating film 1601 and then nitriding the insulating film 1601 by high-density plasma treatment. Note that an insulating film provided over the substrate 1600 may be provided as a single layer or as a stacked structure with three or more layers.

Figure 16B:
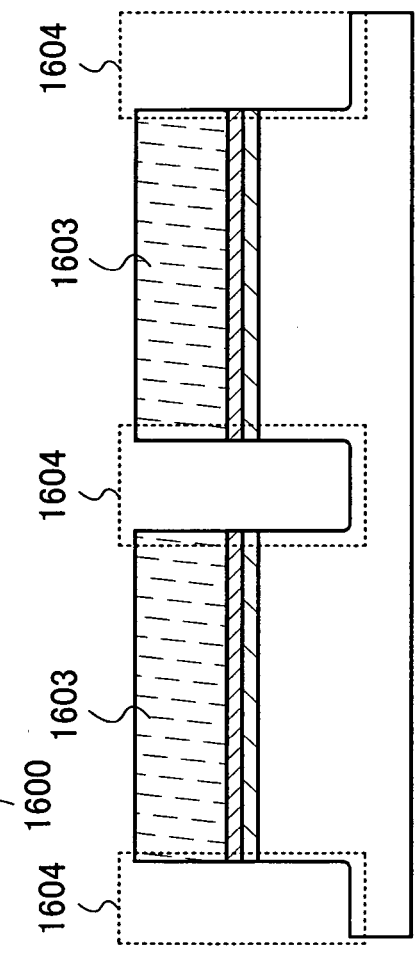

Next, as shown in FIG. 16B, a pattern of a resist mask 1603 is selectively formed over the insulating film 1602 and etching is performed by selective etching using the resist mask 1603 as a mask; accordingly, depressed portions 1604 are selectively formed in the substrate 1600. Etching of the substrate 1600, the insulating films 1601 and 1602 can be performed by dry etching using plasma.

Figure 16C:
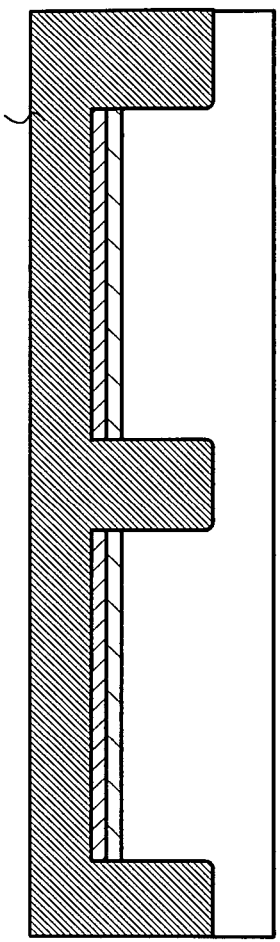

Next, as shown in FIG. 16C, after removing the pattern of the resist mask 1603, an insulating film 1605 is formed to fill the depressed portions 1604 formed in the substrate 1600.

The insulating film 1605 is formed by a CVD method, a sputtering method, or the like, using an insulating material such as silicon oxide, silicon nitride, silicon oxynitride ($SiO_xN_y$, where x>y>0), or silicon nitride oxide ($SiN_xO_y$, where x>y>0). Here, as the insulating film 1605, a silicon oxide film is formed using a TEOS (tetraethyl orthosilicate) gas by a normal pressure CVD method or a low pressure CVD method.

Figure 17A:
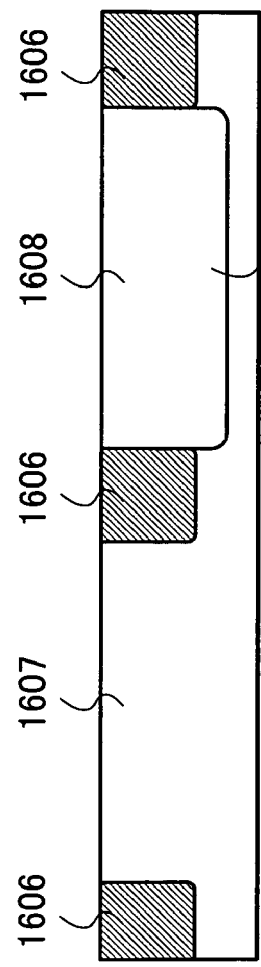
FIGS. 17A to 17C are partial cross-sectional diagrams of a transistor included in a semiconductor device of the present invention.

Next, as shown in FIG. 17A, a surface of the substrate 1600 is exposed by performing a grinding treatment, a polishing treatment, or a CMP (chemical mechanical polishing) treatment. Here, by exposing the surface of the substrate 1600, regions 1607 and 1608 are provided between insulating films 1606 formed in the depressed portions 1604 of the substrate 1600. Note that the insulating films 1606 are obtained by removing the insulating film 1605 formed over the surface of the substrate 1600 by a grinding treatment, a polishing treatment, or a CMP treatment. Subsequently, by selectively introducing a p-type impurity element, a p well 1609 is formed in the region 1608.

As a p-type impurity element, boron (B), aluminum (Al), gallium (Ga), or the like can be used. Here, boron (B) is doped in the region 1608 as the impurity element.

In this embodiment, although the region 1607 is not doped with an impurity element because an n-type semiconductor substrate is used as the semiconductor substrate 1600, an n well may be formed in the region 1607 by introduction of an n-type impurity element. As an n-type impurity element, phosphorus (P), arsenic (As), or the like can be used.

When a p-type semiconductor substrate is used, on the other hand, the region 1607 may be doped with an n-type impurity element to form an n well, whereas the region 1608 may not be doped with an impurity element.

Figure 17B:
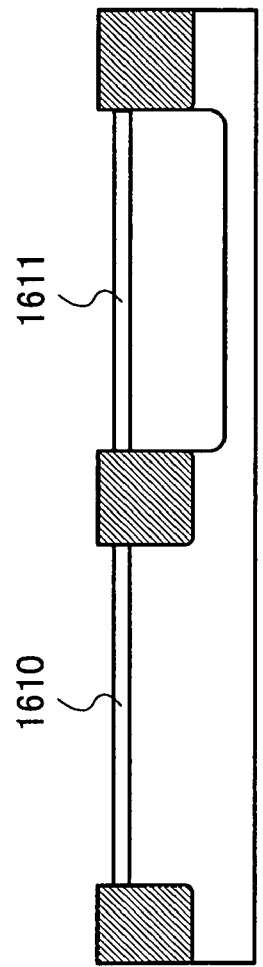

Next, as shown in FIG. 17B, insulating films 1610 and 1611 are formed over surfaces of the regions 1607 and 1607 of the substrate 1600, respectively.

For example, surfaces of the regions 1607 and 1608 provided in the substrate 1600 are oxidized by for example heat treatment, so that the insulating films 1610 and 1611 can be formed of silicon oxide films. Alternatively, the insulating films 1610 and 1611 may be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 1610 and 1611 can be formed by plasma treatment as described above. For example, the insulating films 1610 and 1611 can be formed using a silicon oxide ($SiO_x$) film or a silicon nitride ($SiN_x$) film which is obtained by application of high-density plasma oxidation or high-density plasma nitridation treatment to the surfaces of the regions 1607 and 1608 provided in the substrate 1600. Furthermore, after applying high-density plasma oxidation treatment to the surfaces of the regions 1607 and 1608, high-density plasma nitridation treatment may be performed. In that case, silicon oxide films are formed on the surfaces of the regions 1607 and 1608, and then silicon oxynitride films are formed on the silicon oxide films. Thus, the insulating films 1610 and 1611 are each formed to have a stacked structure of the silicon oxide film and the silicon oxynitride film. In addition, high-density plasma oxidation or high-density nitridation treatment may be applied to the silicon oxide films after silicon oxide films are formed on the surfaces of the regions 1607 and 1608 by a thermal oxidation method.

The insulating films 1610 and 1611 formed in the regions 1607 and 1608 of the substrate 1600, respectively, function as gate insulating films of transistors which are completed later.

Figure 17C:
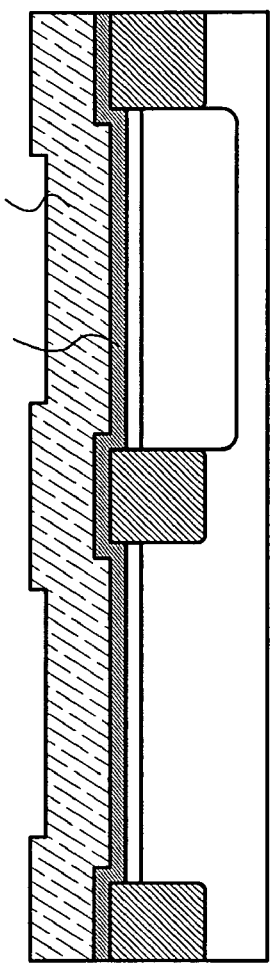

Next, as shown in FIG. 17C, a conductive film is formed so as to cover the insulating films 1610 and 1611 which are formed over the regions 1607 and 1608 provided in the substrate 1600, respectively. Here, an example is shown in which conductive films 1612 and 1613 are sequentially stacked as the conductive film. Needless to say, the conductive film may be formed to have a single layer or a stacked structure of three or more layers.

As materials of the conductive films 1612 and 1613, an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked structure is employed in which the conductive film 1612 is formed using tantalum nitride and the conductive film 1613 is formed thereover using tungsten. Alternatively, it is also possible to form the conductive film 1612 using a single-layer film or a stacked film of tantalum nitride, tungsten nitride, molybdenum nitride, and/or titanium nitride and form the conductive film 1613 using a single-layer film or a stacked film of tungsten, tantalum, molybdenum, and/or titanium.

Figure 18A:
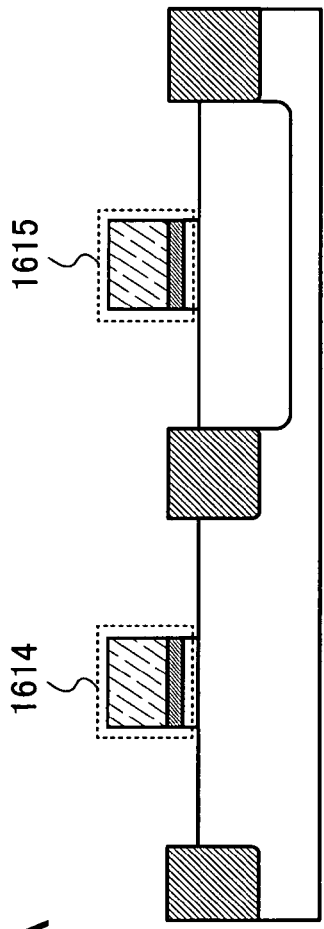
FIGS. 18A to 18C are partial cross-sectional diagrams of a transistor included in a semiconductor device of the present invention.

Next, as shown in FIG. 18A, the stacked conductive films 1612 and 1613 are selectively removed by etching, so that the conductive films 1612 and 1613 remain above part of the regions 1607 and 1608 of the substrate 1600, respectively. Thus, conductive films 1614 and 1615 each functioning as a gate electrode are formed. In addition, here, surfaces of the regions 1607 and 1608 of the substrate 1600 that do not overlap with the conductive films 1614 and 1615 are exposed.

Specifically, in the region 1607 of the substrate 1600, a portion of the insulating film 1610 formed under the conductive film 1614 that does not overlap with the conductive film 1614 is selectively removed, and an end portion of the conductive film 1614 and an end portion of the insulating film 1610 are made to roughly match. In addition, in the region 1608, a part of the insulating film 1611 formed under the conductive film 1615 that does not overlap with the conductive film 1615 is selectively removed and an end portion of the conductive film 1615 and an end portion of the insulating film 1611 are made to roughly match.

In this case, insulating films and the like of the portions that do not overlap may be removed at the same time as forming the conductive films 1614 and 1615. Alternatively, the insulating films and the like of the portions that do not overlap may be removed using the resist mask that is left after forming the conductive films 1614 and 1615 or the conductive films 1614 and 1615 as a mask.

Figure 18B:
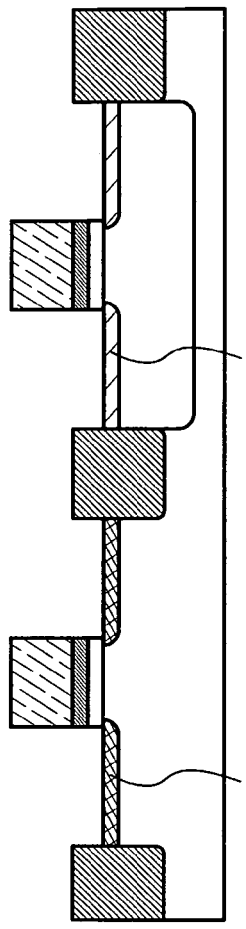

Next, as shown in FIG. 18B, the regions 1607 and 1608 of the substrate 1600 are selectively doped with an impurity element. Here, the region 1608 is selectively doped with a low-concentration n-type impurity element with the conductive film 1615 as a mask to form an impurity region 1617. On the other hand, the region 1607 is selectively doped with a low-concentration p-type impurity element with the conductive film 1614 as a mask to form an impurity region 1616. As an n-type impurity element, phosphorus (P), arsenic (As), or the like can be used. As a p-type impurity element, boron (B), aluminum (Al), gallium (Ga), or the like can be used.

Next, sidewalls 1618 that are in contact with side surfaces of the conductive films 1614 and 1615 are formed. Specifically, by a plasma CVD method, a sputtering method, or the like, a single layer of a film containing an inorganic material such as silicon, an oxide of silicon, or a nitride or silicon, or a film containing an organic material such as an organic resin; or stacked layers thereof is/are formed. Then, the insulating films are selectively etched by anisotropic etching mainly in a perpendicular direction, so as to be formed in contact with the side surfaces of the conductive films 1614 and 1615. Note that the sidewalls 1618 are used as masks for doping when an LDD (lightly doped drain) region is formed. In addition, here, the sidewalls 1618 are formed to be in contact with side surfaces of an insulating film or a floating gate electrode formed under the conductive films 1614 and 1615.

Figure 18C:
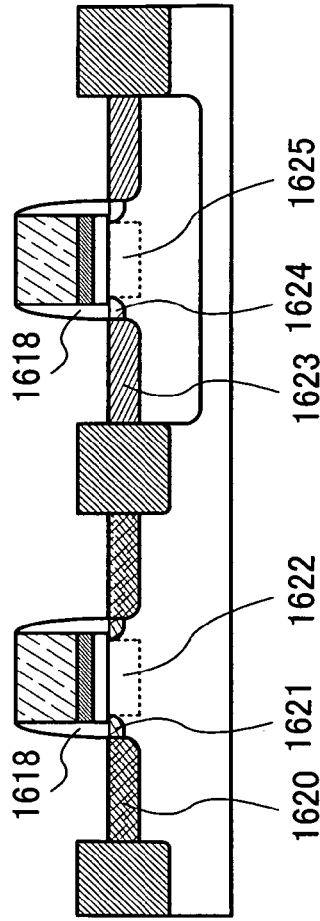

Next, by doping each of the regions 1607 and 1608 of the substrate 1600 with an impurity element using the sidewalls 1618 and the conductive films 1614 and 1615 as masks, an impurity regions each functioning as a source region or drain region are formed (see FIG. 18C). Here, the region 1608 of the substrate 1600 is doped with a high-concentration n-type impurity element using the sidewalls 1618 and the conductive film 1615 as masks, and the region 1607 is doped with a high-concentration p-type impurity element using the sidewalls 1618 and the conductive film 1614 as masks.

As a result, in the region 1607 of the substrate 1600, an impurity region 1620 forming a source region or drain region, a low-concentration impurity region 1621 forming an LDD region, and a channel forming region 1622 are formed. In addition, in the region 1608 of the substrate 1600, an impurity region 1623 forming a source region or drain region, a low-concentration impurity region 1624 forming an LDD region, and a channel forming region 1625 are formed.

Note that in this embodiment, doping with impurity elements is performed in a state where the regions 1607 and 1608 of the substrate 1600 that do not overlap with the conductive films 1614 and 1615 are exposed. Accordingly, the channel forming regions 1622 and 1625 formed in the regions 1607 and 1608 of the substrate 1600, respectively, can be formed in a self-aligned manner with the conductive films 1614 and 1615, respectively.

Next, as shown in FIG. 19A, a second insulating film 1626 is formed so as to cover the insulating films, conductive films, and the like provided over the regions 1607 and 1608 of the substrate 1600, and opening portions 1627 are formed in the insulating film 1626.

The second insulating film 1626 can be formed with a single layer or a stacked layer of an insulating film containing oxygen and/or nitrogen such as silicon oxide (SiOx), silicon nitride ($SiN_x$), silicon oxynitride ($SiO_xN_y$ where x>y), or silicon nitride oxide ($SiN_xO_y$ where x>y); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or an aryl group) is used. Also, a fluoro group may be used as the substituent, or both a fluoro group and an organic group containing at least hydrogen may be used.

Next, as shown in FIG. 19B, a conductive film 1628 is formed in each of the opening portions 1627 using a CVD method, and conductive films 1629a to 1629d are selectively formed over the insulating film 1612 so as to be electrically connected to the conductive films 1628

The conductive films 1628 and 1629a to 1629d are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing such an element as its main component by a CVD method, a sputtering method or the like. An alloy material containing aluminum as its main component corresponds to, for example, a material which contains aluminum as its main component and also contains nickel, or a material which contains aluminum as its main component and also contains nickel and one or both of carbon and silicon. The conductive films 1628 and 1629a to 1629d are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are suitable materials for forming the conductive films 1628 because they have high resistance and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the conductive films 1628 and the crystalline semiconductor film can be obtained. Here, the conductive films 1628 can be formed by selective growth of tungsten (W) by a CVD method.

By the above steps, a p-type transistor formed in the region 1607 of the substrate 1600 and an n-type transistor formed in the region 1608 can be manufactured.

Note that a structure of the transistor is not limited to that above, and for example, the structure may be an inversely staggered structure, a finFET structure, or the like. Note that with a finFET structure, a short-channel effect that occurs along with reduction in transistor size can be suppressed.

This embodiment can be appropriately combined with embodiment modes and other embodiments described in this specification.

Embodiment 7

In this embodiment, uses of a wireless tag, which is an example of application modes of a semiconductor device of the present invention, will be described. A wireless tag can be used as a so-called ID label, ID tag, or ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, everyday articles, tags on products such as an electronic device or on packs. An electronic device refers to a liquid crystal display device, an EL display device, a television set (also simply called a TV set, a TV receiver, or a television receiver), a cellular phone, and the like. Hereinafter, an application of the present invention and an example of a product with the wireless tag are described with reference to FIGS. 20A to 20E.

Figure 20A:
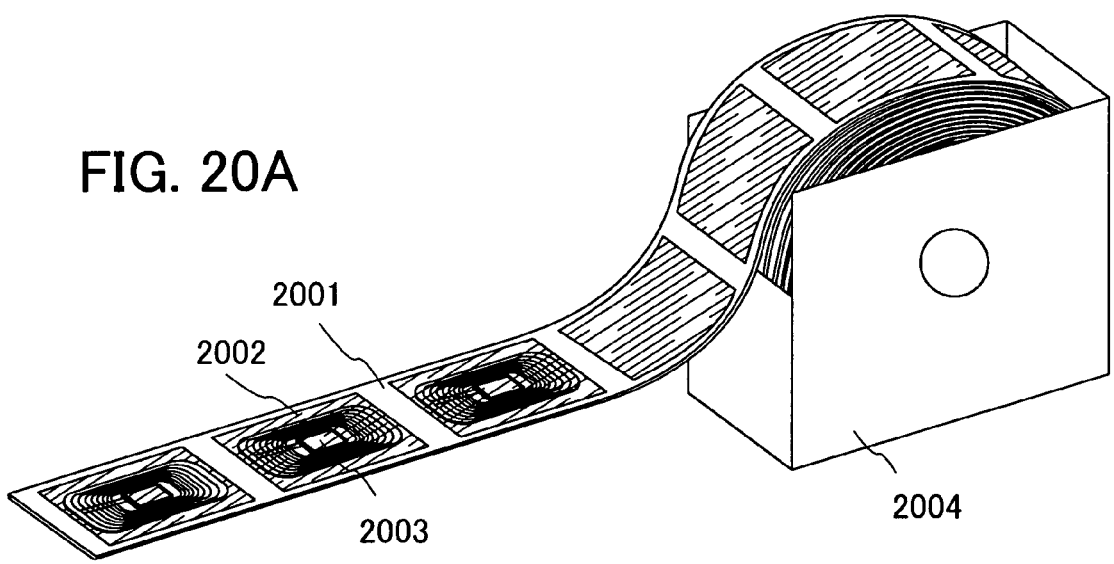
FIGS. 20A to 20E each describe a usage mode of a semiconductor device of the present invention.

FIG. 20A illustrates an example of a state of completed products of wireless tags of the present invention. On a label board (separate paper) 2001, a plurality of ID labels 2003 each incorporating a wireless tag 2002 are formed. The ID labels 2003 are held in a box 2004. In addition, on each of the ID labels 2003, information on a product or service (a name of the product, a brand, a trademark, a trademark owner, a seller, a manufacturer, and the like) is written, while an ID number that is unique to the product (or the kind of the product) is assigned to the incorporated wireless tag to make it possible to easily figure out forgery, infringement of intellectual property rights such as a patent right and a trademark right, and illegality such as unfair competition. Moreover, a lot of information that cannot be fully written on a container of the product or the label, for example, the production area, selling area, quality, raw material, efficacy, use, quantity, shape, price, production method, usage, time of the production, time of the use, expiration date, instructions of the product, information on the intellectual property of the product, or the like can be inputted in the wireless tag so that traders and consumers can access the information using a simple reader. Note that if a memory incorporated in the wireless tag is a write-once memory, since data cannot be rewritten, high security is realized. In addition, even with a rewritable memory, by using a password or the like, it is possible to have a mechanism where traders and consumers cannot rewrite or delete the information. Note that a structure may be employed in which the wireless tag is provided with a display portion so that such information can be displayed.

Figure 20B:
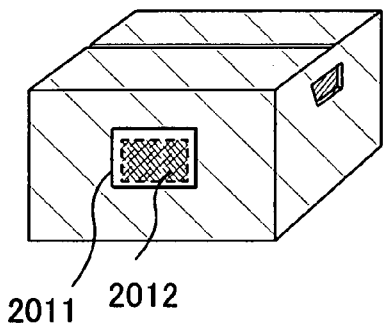

FIG. 20B illustrates a label-shaped wireless tag 2011 incorporating a wireless tag 2012. By being provided with the wireless tag 2011, the products can be managed easily. For example, in the case where the product is stolen, the pathway of the product can be traced, so that the criminal who stole the product can be figured out quickly. By thus being provided with the wireless tag, products that are superior in so-called traceability can be distributed.

Figure 20C:
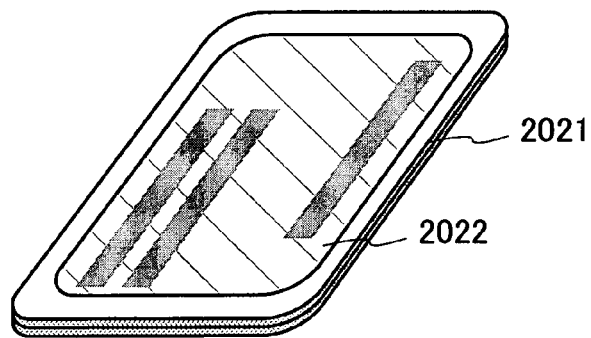

FIG. 20C illustrates an example of a state of a completed product of an ID card 2021 including a wireless tag 2022. The ID card 2021 includes all kinds of cards such as a cash card, a credit card, a prepaid card, an electronic ticket, electronic money, a telephone card, and a membership card. In addition, a structure may be employed in which the front side of the ID card 2021 is provided with a display portion to display a wide range of information.

Figure 20D:
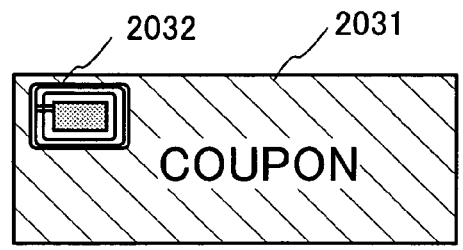

FIG. 20D illustrates a state of a completed product of a bearer bond 2031. A wireless tag 2032 is embedded in the bearer bond 2031 and is protected by a resin formed in the periphery thereof. Here, the resin is filled with a filler. The bearer bond 2031 can be formed in the same manner as a wireless tag of the present invention. Note that the above bearer bond includes stamps, tickets, admission tickets, merchandise coupons, book coupons, stationery coupons, beer coupons, rice coupons, various gift coupons, various service coupons, and the like. Needless to say, the bearer bond is not limited thereto. In addition, when the wireless tag 2032 of the present invention is provided in bills, coins, securities, bearer bonds, documents, or the like, an authentication function can be provided; therefore, forgery can be prevented with the utilization of the authentication function.

Figure 20E:
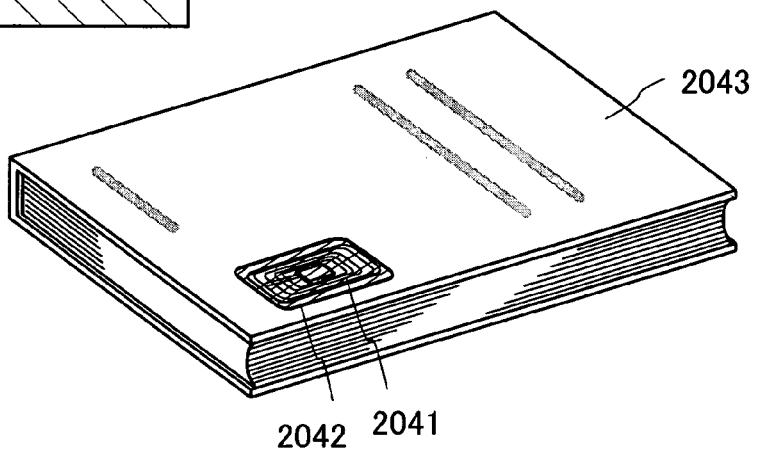

FIG. 20E illustrates a book 2043 to which an ID label 2041 including a wireless tag 2042 is attached. The wireless tag 2042 of the present invention is fixed on goods by, for example, being attached to a surface or embedded therein. As illustrated in FIG. 20E, the wireless tag 2042 can be embedded in paper of a book, or embedded in an organic resin of a package. Since the wireless tag 2042 of the present invention can realize a small size, a thin shape, and lightweight, the wireless tag can be fixed on goods without spoiling the design thereof.

In addition, although not illustrated here, the efficiency of a system such as an inspection system can be improved by provision of the wireless tag of the present invention in, for example, packaging containers, storage media, personal belongings, foods, clothing, everyday articles, electronic devices, or the like. In addition, counterfeits and theft can be prevented by provision of the wireless tag on vehicles. Individual creatures such as animals can be easily identified by being implanted with the wireless tag. For example, year of birth, sex, breed, or the like can be easily identified by implantation of the wireless tag in creatures such as domestic animals.

In this way, the wireless tag of the present invention can be used for various products. In particular, the wireless tag of the present invention has a feature that by reducing current consumption of the incorporated nonvolatile memory during writing, a wide communication range in which writing is possible is provided for a passive type wireless tag, and a long battery lifetime is provided for an active type wireless tag; therefore, it is convenient and effective.

This embodiment can be appropriately combined with embodiment modes and other embodiments described in this specification.

This application is based on Japanese Patent Application serial no. 2006-347278 filed with Japan Patent Office on Dec. 25, 2006, the entire contents of which are hereby incorporated by reference.

What is claimed is:

1. A memory device comprising:
 a memory cell array including a memory cell comprising a memory element, a word line electrically connected to the memory cell, and a bit line electrically connected to the memory cell;
 a word line driver circuit for driving the word line;
 a bit line driver circuit for driving the bit line;
 a writing circuit operationally connected to the bit line driver circuit and the word line driver circuit, the writing circuit comprising a wiring and a resistance element connected to the wiring in series connectable to the bit line through a switch; and
 a voltage source input terminal for supplying a current to the memory element during a writing operation of the memory element through the wiring, the resistance element, and the bit line,
 wherein the resistance element is provided in the writing circuit.

2. A memory device according to claim 1, wherein a resistance of the memory element is changed from a high resistance state to a low resistance state by writing in the memory element.

3. A memory device according to claim 1, wherein the resistance element is a resistor including a semiconductor layer, a metal thin film, a diode-connected transistor, or a transistor in which a gate electrode is controlled.

4. A memory device according to claim 1,
 wherein the memory element is a nonvolatile memory,
 wherein the nonvolatile memory has a low resistance state and a high resistance state.

5. A memory device according to claim 4, wherein a resistance of the resistance element is less than or equal to 1/3 of a resistance of the nonvolatile memory in the high resistance state.

6. A memory device according to claim 4, wherein a resistance of the resistance element is less than or equal to 1/10 of a resistance of the nonvolatile memory in the high resistance state.

7. A memory device according to claim 4, wherein a resistance of the resistance element is more than or equal to a resistance of the nonvolatile memory in the low resistance state.

8. A memory device according to claim 4, wherein a resistance of the resistance element is more than or equal to 3 times a resistance of the nonvolatile memory in the low resistance state.

9. A memory device according to claim 4, wherein the nonvolatile memory in the high resistance state and the low resistance state has a resistance ratio that is more than or equal to 10 times.

10. A semiconductor device according to claim 1,
 wherein the semiconductor device includes at least the memory and an antenna,
 wherein a wireless communication is performed.

11. A semiconductor device according to claim 10, wherein the semiconductor device includes a battery.

12. A memory device comprising:
 a memory cell array including a memory cell comprising a memory element, a word line electrically connected to the memory cell, and a bit line electrically connected to the memory cell;
 a word line driver circuit for driving the word line;
 a bit line driver circuit for driving the bit line;
 a writing circuit operationally connected to the bit line driver circuit and the word line driver circuit, the writing circuit comprising a wiring and a resistance element connected to the wiring in series connectable to the bit line through a switch;
 a reading circuit operationally connected to the bit line driver circuit via the switch; and
 a voltage source input terminal for supplying a current to the memory element during a writing operation of the memory element through the wiring, the resistance element, and the bit line,
 wherein the resistance element is provided in the writing circuit.

13. A memory device according to claim 12, wherein a resistance of the memory element is changed from a high resistance state to a low resistance state by writing in the memory element.

14. A memory device according to claim 12, wherein the resistance element is a resistor including a semiconductor layer, a metal thin film, a diode-connected transistor, or a transistor in which a gate electrode is controlled.

15. A memory device according to claim 12,
 wherein the memory element is a nonvolatile memory,
 wherein the nonvolatile memory has a low resistance state and a high resistance state.

16. A memory device according to claim 15, wherein a resistance of the resistance element is less than or equal to 1/3 of a resistance of the nonvolatile memory in the high resistance state.

17. A memory device according to claim 15, wherein a resistance of the resistance element is less than or equal to 1/10 of a resistance of the nonvolatile memory in the high resistance state.

18. A memory device according to claim 15, wherein a resistance of the resistance element is more than or equal to a resistance of the nonvolatile memory in the low resistance state.

19. A memory device according to claim 15, wherein a resistance of the resistance element is more than or equal to 3 times a resistance of the nonvolatile memory in the low resistance state.

20. A memory device according to claim 15, wherein the nonvolatile memory in the high resistance state and the low resistance state has a resistance ratio that is more than or equal to 10 times.

21. A semiconductor device according to claim 12,
wherein the semiconductor device includes at least the memory and an antenna,
wherein a wireless communication is performed.

22. A semiconductor device according to claim 21, wherein the semiconductor device includes a battery.

23. A memory device comprising:
a memory cell array including a memory cell comprising a memory element, a transistor, a word line connected to the transistor, and a bit line connected to the memory element;
a word line driver circuit for driving the word line;
a bit line driver circuit for driving the bit line;
a writing circuit operationally connected to the bit line driver circuit and the word line driver circuit, the writing circuit comprising a wiring and a resistance element connected to the wiring in series connectable to the bit line through a switch;
a reading circuit operationally connected to the bit line driver circuit via the switch; and
a voltage source input terminal for supplying a current to the memory element during a writing operation of the memory element through the wiring, the resistance element, the bit line, and the transistor,
wherein the resistance element is provided in the writing circuit.

24. A memory device according to claim 23, wherein a resistance of the memory element is changed from a high resistance state to a low resistance state by writing in the memory element.

25. A memory device according to claim 23, wherein the resistance element is a resistor including a semiconductor layer, a metal thin film, a diode-connected transistor, or a transistor in which a gate electrode is controlled.

26. A memory device according to claim 23,
wherein the memory element is a nonvolatile memory,
wherein the nonvolatile memory has a low resistance state and a high resistance state.

27. A memory device according to claim 26, wherein a resistance of the resistance element is less than or equal to $\frac{1}{3}$ of a resistance of the nonvolatile memory in the high resistance state.

28. A memory device according to claim 26, wherein a resistance of the resistance element is less than or equal to $\frac{1}{10}$ of a resistance of the nonvolatile memory in the high resistance state.

29. A memory device according to claim 26, wherein a resistance of the resistance element is more than or equal to a resistance of the nonvolatile memory in the low resistance state.

30. A memory device according to claim 26, wherein a resistance of the resistance element is more than or equal to 3 times a resistance of the nonvolatile memory in the low resistance state.

31. A memory device according to claim 26, wherein the nonvolatile memory in the high resistance state and the low resistance state has a resistance ratio that is more than or equal to 10 times.

32. A semiconductor device according to claim 23,
wherein the semiconductor device includes at least the memory and an antenna,
wherein a wireless communication is performed.

33. A semiconductor device according to claim 32, wherein the semiconductor device includes a battery.

* * * * *

UNITED STATES PATENT AND TRADEMARK OFFICE
CERTIFICATE OF CORRECTION

| | |
|---|---|
| PATENT NO. | : 7,692,999 B2 |
| APPLICATION NO. | : 12/003280 |
| DATED | : April 6, 2010 |
| INVENTOR(S) | : Kiyoshi Kato |

Page 1 of 1

It is certified that error appears in the above-identified patent and that said Letters Patent is hereby corrected as shown below:

At column 6, line 31, please change "11>12" to --I1>I2--.

Signed and Sealed this

Sixth Day of July, 2010

David J. Kappos
*Director of the United States Patent and Trademark Office*